(12) United States Patent
Shishido et al.

(10) Patent No.: US 11,335,746 B2
(45) Date of Patent: May 17, 2022

(54) DISPLAY DEVICE AND ELECTRONIC DEVICE

(71) Applicant: Semiconductor Energy Laboratory Co., Ltd., Kanagawa-ken (JP)

(72) Inventors: Hideaki Shishido, Kanagawa (JP); Naoto Kusumoto, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/743,220

(22) Filed: Jan. 15, 2020

(65) Prior Publication Data

US 2020/0152897 A1 May 14, 2020

Related U.S. Application Data

(63) Continuation of application No. 15/654,108, filed on Jul. 19, 2017, now Pat. No. 10,541,375.

(30) Foreign Application Priority Data

Jul. 21, 2016 (JP) .............................. JP2016-142898

(51) Int. Cl.
*H01L 27/32* (2006.01)
*G09G 3/3225* (2016.01)
(Continued)

(52) U.S. Cl.
CPC ...... *H01L 27/3246* (2013.01); *G02F 1/13306* (2013.01); *G06F 3/0412* (2013.01);
(Continued)

(58) Field of Classification Search
None
See application file for complete search history.

(56) References Cited

U.S. PATENT DOCUMENTS 5,552,346 A * 9/1996 Huang .............. H01L 21/31053
257/E21.244
7,164,151 B2 1/2007 Yamazaki et al.
(Continued)

FOREIGN PATENT DOCUMENTS

EP 3 006 994 A1 4/2016
JP 2004-247373 A 9/2004
(Continued)

OTHER PUBLICATIONS

Kusunoki, K. et al., "Transmissive OLED and Reflective LC Hybrid (TR-Hybrid) Display," SID Digest '16: SID International Symposium Digest of Technical Papers, May 22, 2016, vol. 47, pp. 57-60.
(Continued)

*Primary Examiner* — Anthony Ho
*Assistant Examiner* — Kevin Quinto
(74) *Attorney, Agent, or Firm* — Husch Blackwell LLP

(57) ABSTRACT

A display device with a narrow bezel is provided. The display device includes a pixel circuit and a driver circuit which are provided on the same plane. The driver circuit includes a selection circuit and a buffer circuit. The selection circuit includes a first transistor. The buffer circuit includes a second transistor. The first transistor has a region overlapping with the second transistor. One of a source and a drain of the first transistor is electrically connected to a gate of the second transistor. One of a source and a drain of the second transistor is electrically connected to the pixel circuit.

10 Claims, 20 Drawing Sheets

(51) Int. Cl.

| | | |
|---|---|---|
| *G09G 3/3233* | (2016.01) | |
| *G06F 3/041* | (2006.01) | |
| *G09G 3/3258* | (2016.01) | |
| *G09G 3/20* | (2006.01) | |
| *H01L 29/786* | (2006.01) | |
| *G09G 3/36* | (2006.01) | |
| *G02F 1/133* | (2006.01) | |
| *H01L 51/52* | (2006.01) | |
| *H01L 51/10* | (2006.01) | |
| *H01L 27/12* | (2006.01) | |
| *H01L 51/00* | (2006.01) | |
| *H01L 51/50* | (2006.01) | |

(52) U.S. Cl.
CPC ......... *G09G 3/2092* (2013.01); *G09G 3/3225* (2013.01); *G09G 3/3233* (2013.01); *G09G 3/3258* (2013.01); *G09G 3/3648* (2013.01); *H01L 27/3262* (2013.01); *H01L 27/3267* (2013.01); *H01L 29/7869* (2013.01); *H01L 51/105* (2013.01); *H01L 51/5212* (2013.01); *G02F 2201/44* (2013.01); *G02F 2203/02* (2013.01); *G06F 3/041* (2013.01); *G06F 2203/04103* (2013.01); *G09G 2310/0291* (2013.01); *H01L 27/1225* (2013.01); *H01L 51/0017* (2013.01); *H01L 51/502* (2013.01)

(56) References Cited

U.S. PATENT DOCUMENTS

| | | | |
|---|---|---|---|
| 7,633,471 | B2 | 12/2009 | Yamazaki et al. |
| 7,746,333 | B2 | 6/2010 | Yamazaki et al. |
| 8,044,946 | B2 | 10/2011 | Yamazaki et al. |
| 8,284,138 | B2 | 10/2012 | Yamazaki et al. |
| 8,384,699 | B2 | 2/2013 | Yamazaki et al. |
| 8,669,925 | B2 | 3/2014 | Yamazaki et al. |
| 8,780,614 | B2 | 7/2014 | Takemura |
| 9,041,453 | B2 | 5/2015 | Miyake et al. |
| 9,318,374 | B2 | 4/2016 | Atsumi et al. |
| 9,429,800 | B2 | 8/2016 | Yamazaki et al. |
| 9,466,615 | B2 | 10/2016 | Miyairi et al. |
| 9,478,187 | B2 | 10/2016 | Miyake et al. |
| 9,564,482 | B2 | 2/2017 | Teraguchi et al. |
| 10,170,486 | B2 | 1/2019 | Atsumi et al. |
| 10,210,785 | B2 | 2/2019 | Sagardoyburu |
| 10,483,293 | B2 | 11/2019 | Miyake |
| 2003/0141504 | A1* | 7/2003 | Kuwabara ......... H01L 29/78648 257/66 |
| 2006/0072047 | A1 | 4/2006 | Sekiguchi |
| 2007/0126969 | A1 | 6/2007 | Kimura et al. |
| 2010/0171905 | A1 | 7/2010 | Huang et al. |
| 2010/0214236 | A1* | 8/2010 | Kim ...................... G06F 3/0418 345/173 |
| 2014/0333855 | A1* | 11/2014 | Park ...................... G06F 3/045 349/12 |
| 2015/0021596 | A1 | 1/2015 | Yamazaki et al. |
| 2015/0187814 | A1 | 7/2015 | Miyairi et al. |
| 2015/0357595 | A1 | 12/2015 | Hong |
| 2016/0140903 | A1* | 5/2016 | In ............................ G09G 3/20 345/76 |
| 2016/0372672 | A1 | 12/2016 | Yamazaki et al. |
| 2018/0012536 | A1 | 1/2018 | Shishido |
| 2020/0083260 | A1 | 3/2020 | Miyake |

FOREIGN PATENT DOCUMENTS

| | | |
|---|---|---|
| JP | 2006-147712 A | 6/2006 |
| JP | 2012-178554 A | 9/2012 |
| JP | 2013-102133 A | 5/2013 |
| JP | 2014-211621 A | 11/2014 |
| JP | 2015-092247 A | 5/2015 |
| JP | 2015-144271 A | 8/2015 |
| JP | 2015-179259 A | 10/2015 |
| JP | 2015-194577 A | 11/2015 |
| JP | 2016-081052 A | 5/2016 |
| WO | WO 2004/053819 A1 | 6/2004 |
| WO | WO 2015/097589 A1 | 7/2015 |

OTHER PUBLICATIONS

Sakuishi, T. et al., "Transmissive OLED and Reflective LC Hybrid (TR-Hybrid) Display with High Visibility and Low Power Consumption," SID Digest '16: SID International Symposium Digest of Technical Papers, May 22, 2016, vol. 47, pp. 735-738.

Ohide, T. et al., "Application of Transfer Technology to Manufacturing of Transmissive OLED and Reflective LC Hybrid (TR-Hybrid) Display," SID Digest '16: SID International Symposium Digest of Technical Papers, May 22, 2016, vol. 47, pp. 1002-1004.

* cited by examiner

FIG. 15A
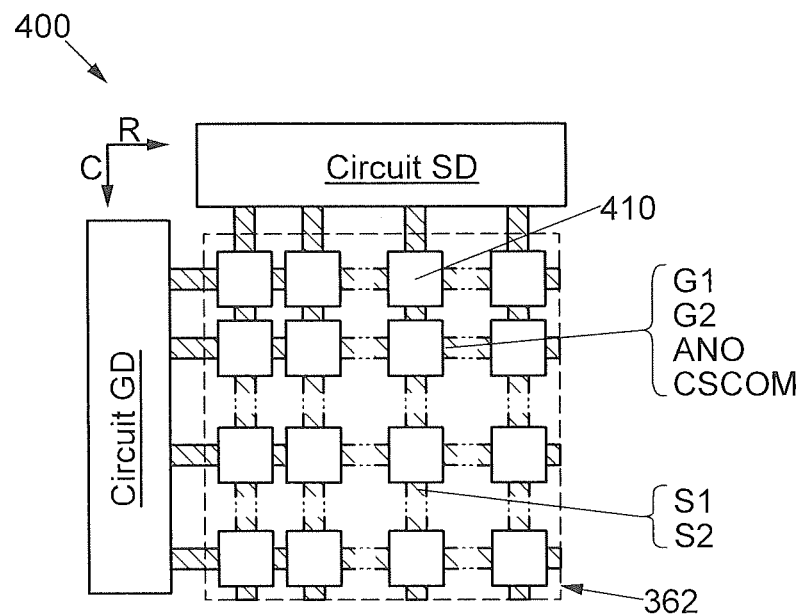
FIG. 15B1
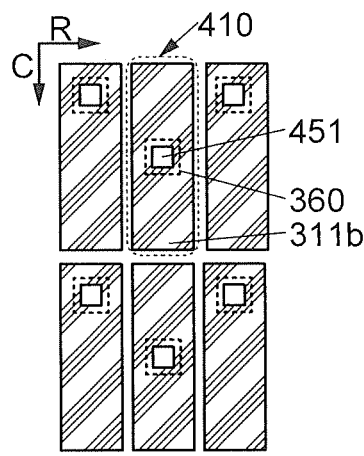
FIG. 15B2
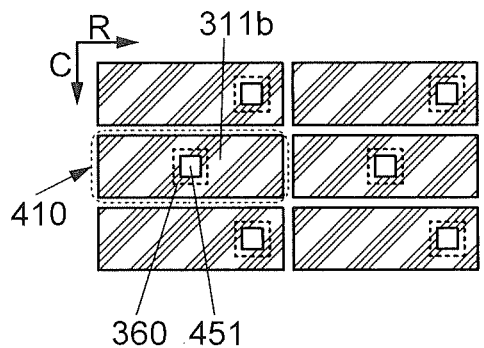

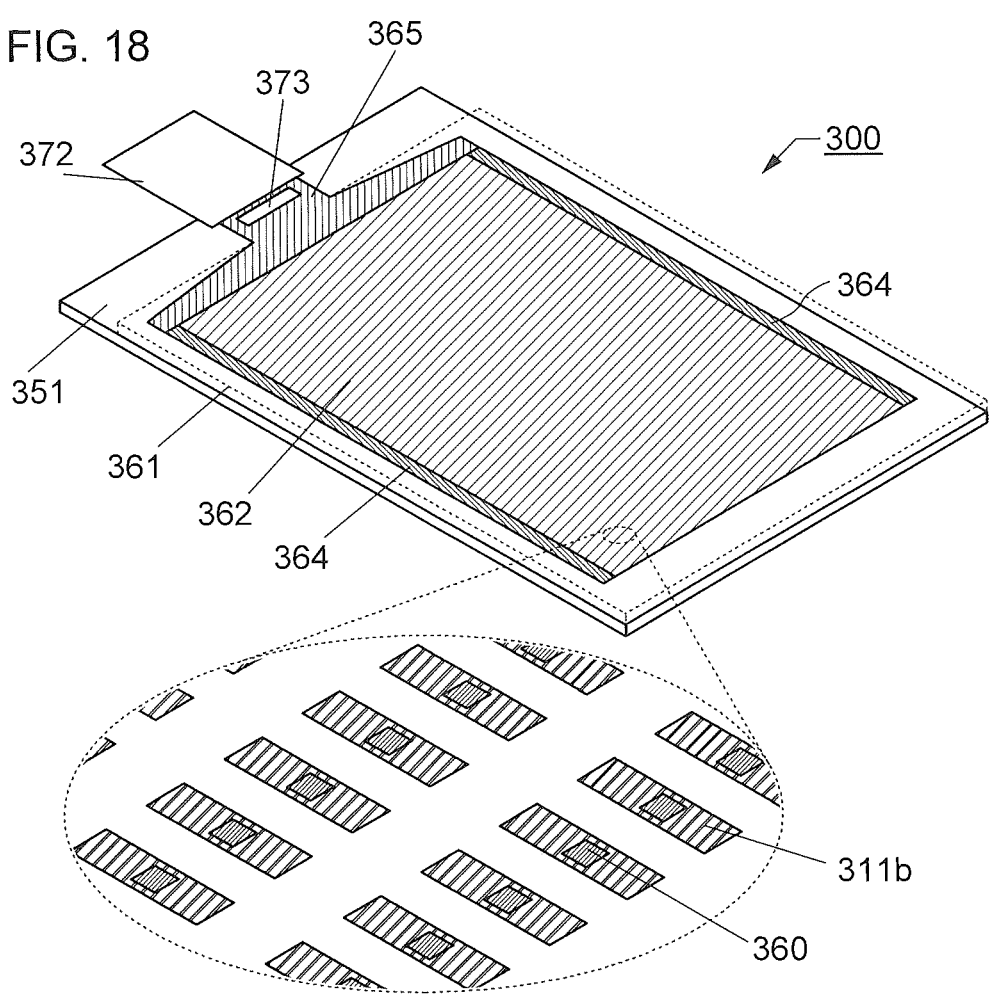

DISPLAY DEVICE AND ELECTRONIC DEVICE

This application is a continuation of copending U.S. application Ser. No. 15/654,108, filed on Jul. 19, 2017 which is incorporated herein by reference.

BACKGROUND OF THE INVENTION

1. Field of the Invention

The present invention relates to an object, a method, or a manufacturing method. The present invention relates to a process, a machine, manufacture, or a composition of matter. One embodiment of the present invention particularly relates to a semiconductor device, a light-emitting device, a display device, an electronic device, a lighting device, a driving method thereof, or a manufacturing method thereof. In particular, one embodiment of the present invention relates to a display device (display panel). Another embodiment of the present invention relates to an electronic device, a light-emitting device, or a lighting device which includes a display device, or a manufacturing method thereof.

In this specification and the like, a semiconductor device generally means a device that can function by utilizing semiconductor characteristics. A transistor, a semiconductor circuit, an arithmetic device, a memory device, and the like are each one embodiment of the semiconductor device. A light-emitting device, a display device, a lighting device, and an electronic device may each include a semiconductor device.

2. Description of the Related Art

Display devices such as a liquid crystal display device and an EL display device, which are used for electronic devices or the like, are required to have narrower bezels so as to be reduced in size and designed more freely. In order to narrow the bezel, it is effective to provide a pixel portion and a part or the whole of a driver circuit over the same substrate.

In general, such a driver circuit is formed using a complementary metal oxide semiconductor (CMOS) circuit; however, the driver circuit can also be formed using transistors having the same conductivity type. For example, Patent Document 1 discloses a technique in which a circuit such as a shift register is formed using transistors having the same conductivity type.

REFERENCE

Patent Document

[Patent Document 1] Japanese Published Patent Application No. 2014-211621

SUMMARY OF THE INVENTION

An object of one embodiment of the present invention is to provide a display device with a narrow bezel. Another object is to provide a display device including a driver circuit having a stacked structure. Another object is to provide a display device that includes a driver circuit including transistors having the same conductivity type. Another object is to provide a display device with high visibility. Another object is to provide a low-power display device. Another object is to provide a novel display device. Another object is to provide an electronic device including the display device (display panel). Another object is to provide a novel electronic device.

Note that the description of these objects does not disturb the existence of other objects. In one embodiment of the present invention, there is no need to achieve all the objects. Other objects will be apparent from and can be derived from the description of the specification and the like.

One embodiment of the present invention relates to a driver circuit with which the bezel of a display device can be narrowed.

One embodiment of the present invention is a display device including a pixel circuit and a driver circuit which are provided on the same plane. The driver circuit includes a selection circuit and a buffer circuit. The selection circuit includes a first transistor. The buffer circuit includes a second transistor. The first transistor has a region overlapping with the second transistor. One of a source and a drain of the first transistor is electrically connected to a gate of the second transistor. One of a source and a drain of the second transistor is electrically connected to the pixel circuit.

Another embodiment of the present invention is a display device including a pixel circuit and a driver circuit which are provided on the same plane. The driver circuit includes a selection circuit and a buffer circuit. The selection circuit includes a first transistor. The buffer circuit includes a second transistor. The pixel circuit includes a third transistor and a fourth transistor. The first transistor has a region overlapping with the second transistor. The third transistor has a region overlapping with the fourth transistor. One of a source and a drain of the first transistor is electrically connected to a gate of the second transistor. One of a source and a drain of the second transistor is electrically connected to a gate of the third transistor.

The transistors included in the driver circuit and the pixel circuit have the same conductivity type, and their channel formation regions each include a metal oxide, for example.

A conductive layer may be provided between the first transistor and the second transistor. The conductive layer is preferably supplied with the lowest potential used in the driver circuit.

The pixel circuit can include a first display element. The first display element has a function of emitting or transmitting visible light.

The pixel circuit can further include a second display element. The second display element has a function of reflecting visible light.

Note that in this specification, the display device may include the following modules in its category: a module in which a connector such as a flexible printed circuit (FPC) or a tape carrier package (TCP) is attached to a display panel; a module having a TCP provided with a printed wiring board at the end thereof; and a module having an integrated circuit (IC) directly mounted by a chip on glass (COG) method over a substrate over which a display element is formed.

According to one embodiment of the present invention, a display device with a narrow bezel can be provided. A display device including a driver circuit having a stacked structure can be provided. A display device that includes a driver circuit including transistors having the same conductivity type can be provided. A display device with high visibility can be provided. A low-power display device can be provided. A novel display device can be provided. An electronic device including the display device (display panel) can be provided. A novel electronic device can be provided.

Note that the description of these effects does not disturb the existence of other effects. One embodiment of the present invention does not necessarily have all the effects. Other effects will be apparent from and can be derived from the description of the specification, the drawings, the claims, and the like.

BRIEF DESCRIPTION OF THE DRAWINGS

FIG. 15A is a block diagram illustrating a display device,
and FIGS. 15B1 and 15B2 illustrate electrodes included in pixels.
FIG. 18 illustrates a structure of a display device.

DETAILED DESCRIPTION OF THE INVENTION

Figure 1:
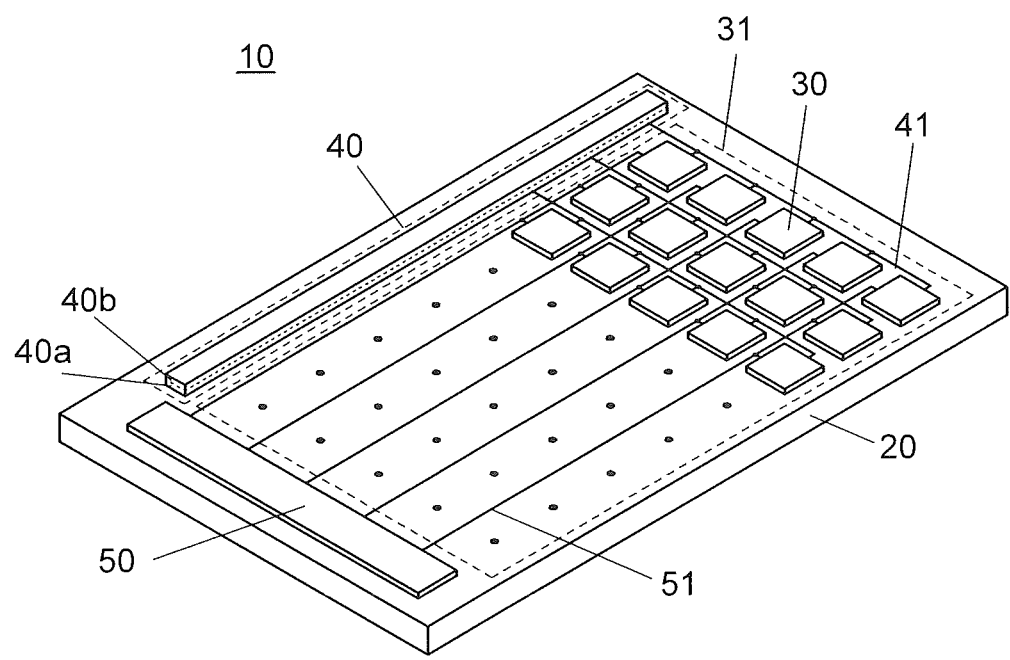
FIG. 1 illustrates a display device.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of the embodiments below.

In the structures of the invention described below, the same portions or portions having similar functions are denoted by the same reference numerals in different drawings, and repetitive description thereof will be omitted. Furthermore, the same hatching pattern is used for portions having similar functions, and the portions are not especially denoted by reference numerals in some cases.

Note that in each drawing referred to in this specification, the size, the layer thickness, or the region of each component is exaggerated for clarity in some cases. Therefore, embodiments of the present invention are not limited to such a scale.

In this specification and the like, ordinal numbers such as "first" and "second" are used in order to avoid confusion among components and do not limit the components numerically.

Embodiment 1

In this embodiment, a display device of one embodiment of the present invention will be described with reference to drawings.

The display device of one embodiment of the present invention is a display device including a pixel circuit and a driver circuit which are provided on the same plane. The driver circuit includes a selection circuit and a buffer circuit. The selection circuit is provided over the buffer circuit. Alternatively, the buffer circuit is provided over the selection circuit.

A signal output from the selection circuit is input to the buffer circuit. The buffer circuit outputs the signal to, for example, a gate line with high capacity to which a plurality of pixels is connected in parallel. Thus, a transistor with a large channel width is used for the buffer circuit; however, such a large transistor poses an obstacle to a narrow bezel.

In one embodiment of the present invention, a transistor used for the buffer circuit and a transistor included in the selection circuit are stacked, whereby the area occupied by the driver circuit can be reduced. Thus, the bezel width of the display device can be narrowed.

FIG. 1 is a schematic perspective view of a display device 10 of one embodiment of the present invention and illustrates a display portion 31, a driver circuit 40, and a driver circuit 50 which are provided over a substrate 20. The display portion 31 includes pixel circuits 30 arranged in matrix. The pixel circuits 30 are electrically connected to the driver circuit 40 through wirings 41. Furthermore, the pixel circuits 30 are electrically connected to the driver circuit 50 through wirings 51. For example, the driver circuit 40 can operate as a gate driver. The driver circuit 50 can operate as a source driver.

In one embodiment of the present invention, the driver circuit 40 has a structure in which a layer 40a and a layer 40b are stacked, so that the bezel of the display device is narrowed. Note that the driver circuit 50 can also have a stacked structure similar to that of the driver circuit 40 described in this embodiment.

The driver circuit 40 will be described with reference to schematic views of FIGS. 2B and 2C. The driver circuit 40 includes a shift register circuit 60 and a buffer circuit 70. The buffer circuit 70 includes a transistor 71. A wiring 21 is an output line of the shift register circuit 60. A wiring 22 is a signal line or a power supply line. The wiring 41 is a gate line connected to the pixels. Note that FIGS. 2B and 2C are schematic cross-sectional views in which the positional relation between a source and a drain of the transistor is different from the actual one for clarity of the connection relation of wirings.

Figure 2A:
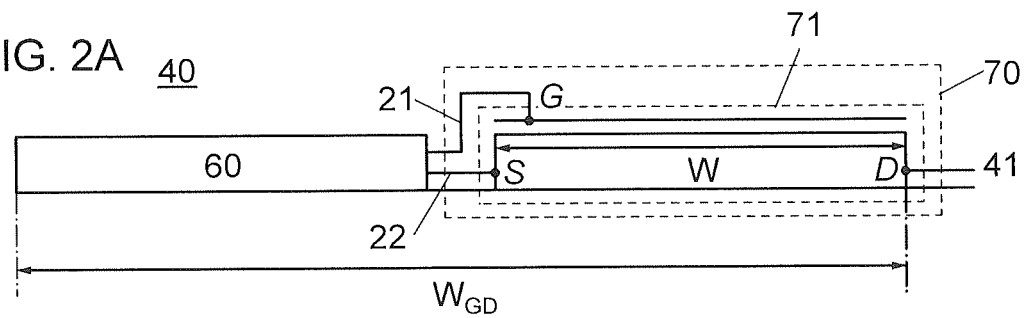
FIGS. 2A to 2E illustrate a driver circuit.

FIG. 2A is a schematic view of a conventional driver circuit. A gate of the transistor 71 is connected to the wiring 21. One of the source and the drain of the transistor 71 is connected to the wiring 22. The other of the source and the drain of the transistor 71 is connected to the wiring 41. Note that the source and the drain may be interchanged with each other depending on the operation of the transistor.

Here, the channel width of the transistor 71 is denoted by W, and the width of the driver circuit 40 is denoted by $W_{GD}$. As described above, the buffer circuit 70 needs a transistor with a large channel width. In the following example, a transistor including a metal oxide in a channel formation region is used. In an organic EL panel having a diagonal size of 13.3 inches and including 8K×4K pixels, the channel width of a transistor used for a buffer circuit is approximately 2000 μm, whereas the channel width of a transistor used for a shift register circuit is at most approximately 300 μm. Thus, the proportion of W in $W_{GD}$ is very high.

Figure 2B:
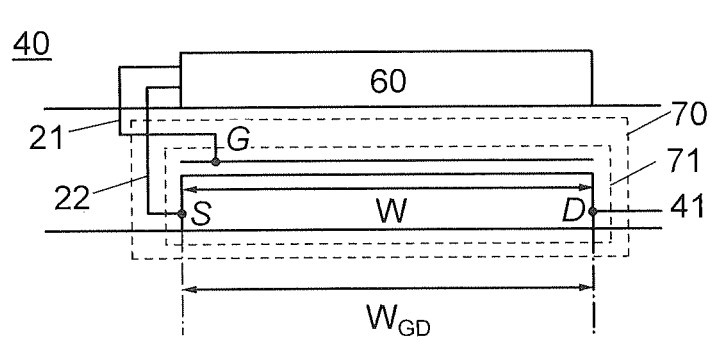
Figure 2C:
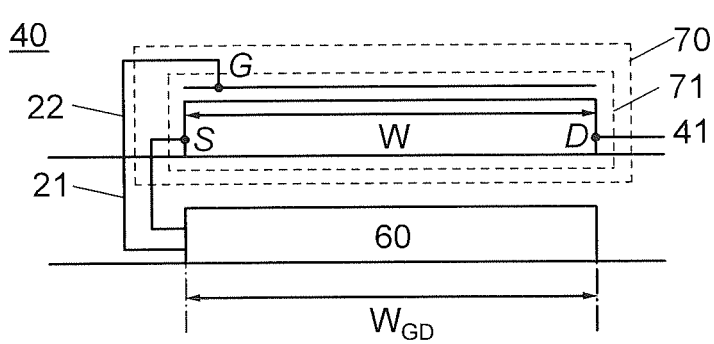

FIG. 2B is a schematic view of the driver circuit 40 of one embodiment of the present invention. By providing the shift register circuit 60 over the buffer circuit 70, the area occupied by the driver circuit 40 can be reduced, which leads to a smaller $W_{GD}$. Thus, the bezel width of the display device can be narrowed.

As illustrated in FIG. 2C, the buffer circuit 70 may be provided over the shift register circuit 60. As in FIG. 2B, $W_{GD}$ can be reduced.

Figure 2D:
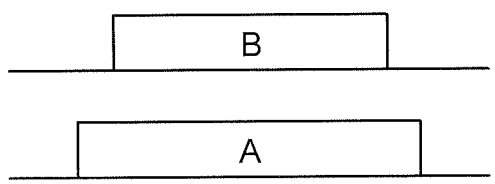
Figure 2E:
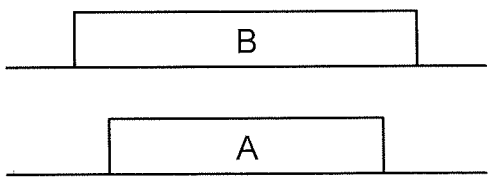

In FIGS. 2B and 2C, the shift register circuit 60 and the buffer circuit 70 have the same width; however, the width of the shift register circuit 60 may be different from that of the buffer circuit 70 as illustrated in FIGS. 2D and 2E. In FIGS. 2D and 2E, A denotes one of the shift register circuit 60 and the buffer circuit 70, and B denotes the other of them. Also in these structures, the area occupied by the driver circuit 40 can be reduced, which leads to a smaller $W_{GD}$.

Figure 3:
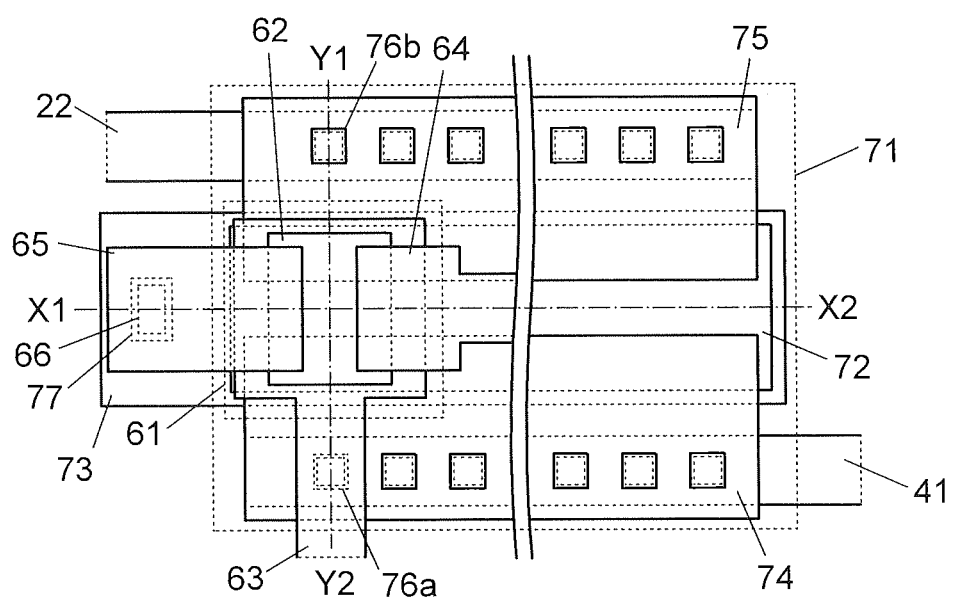
FIG. 3 is a top view illustrating a driver circuit.
Figure 4A:
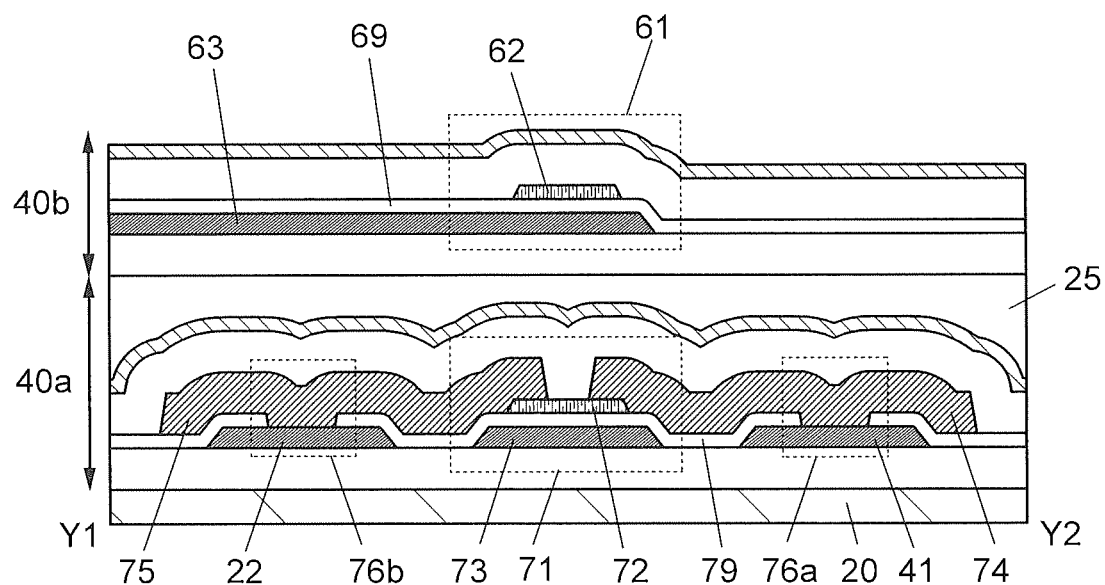
FIGS. 4A and 4B are cross-sectional views illustrating a driver circuit.
Figure 4B:
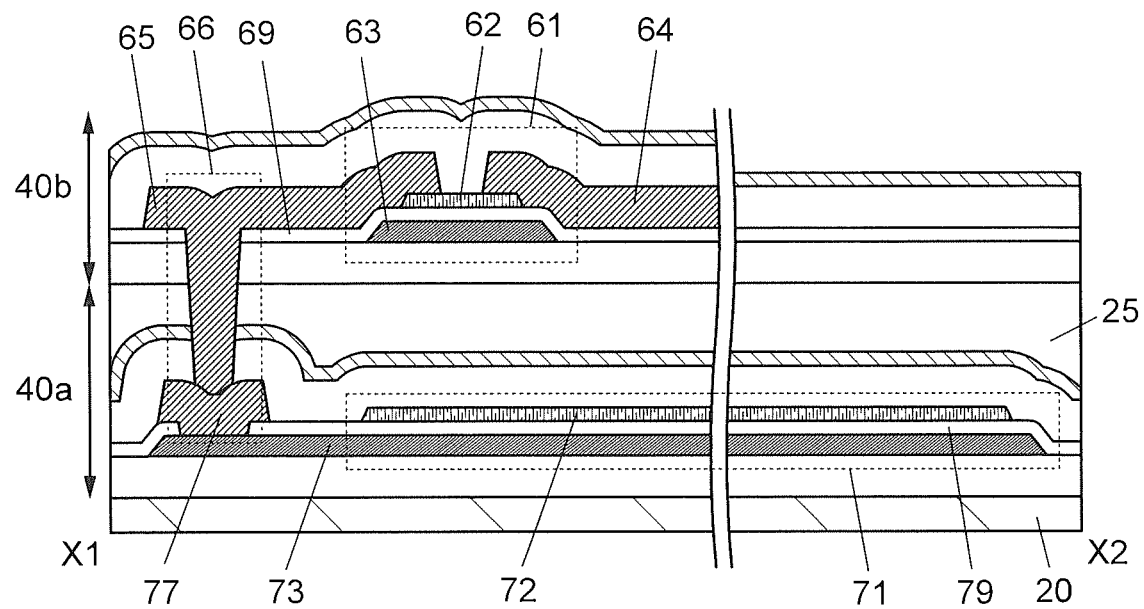

FIG. 3 shows an example of a top view of transistors included in a part of the shift register circuit 60 and the buffer circuit 70 which are illustrated in FIG. 2B. FIG. 4A is a cross-sectional view along Y1-Y2 in FIG. 3, and FIG. 4B is a cross-sectional view along X1-X2 in FIG. 3. Note that some insulating layers and the like are not illustrated or their reference numerals are omitted for simplicity.

The part of the shift register circuit 60 includes a transistor 61 for outputting a signal. The transistor 61 includes a gate electrode 63, a gate insulating film 69, a semiconductor layer 62, a source electrode 64, and a drain electrode 65.

The buffer circuit 70 includes the transistor 71. The transistor 71 includes a gate electrode 73, a gate insulating film 79, a semiconductor layer 72, a source electrode 75, and a drain electrode 74.

By stacking the transistor 61 and the transistor 71, the area occupied by the driver circuit 40 can be reduced. Note that the transistors are not limited to bottom-gate transistors and may be top-gate transistors. Furthermore, a planarization film 25 provided between the transistor 61 and the transistor 71 may be omitted.

In a connection portion 76b, the source electrode 75 of the transistor 71 is electrically connected to the wiring 22. In a connection portion 76a, the drain electrode 74 of the transistor 71 is electrically connected to the wiring 41.

In a connection portion 66, the gate electrode 73 of the transistor 71 is electrically connected to the drain electrode 65 of the transistor 61. In FIG. 4B, the connection portion 66 includes a conductive layer 77 that can be provided in the same step as the source electrode 75 and the drain electrode 74; however, the conductive layer 77 is not necessarily provided.

Figure 5A:
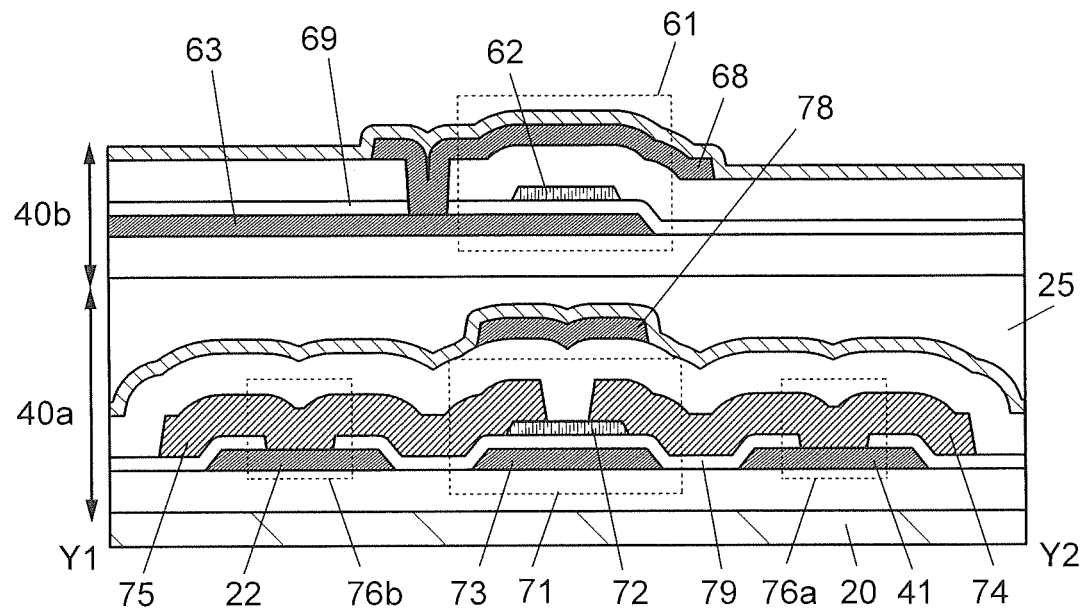
FIGS. 5A and 5B are cross-sectional views illustrating a driver circuit.
Figure 5B:
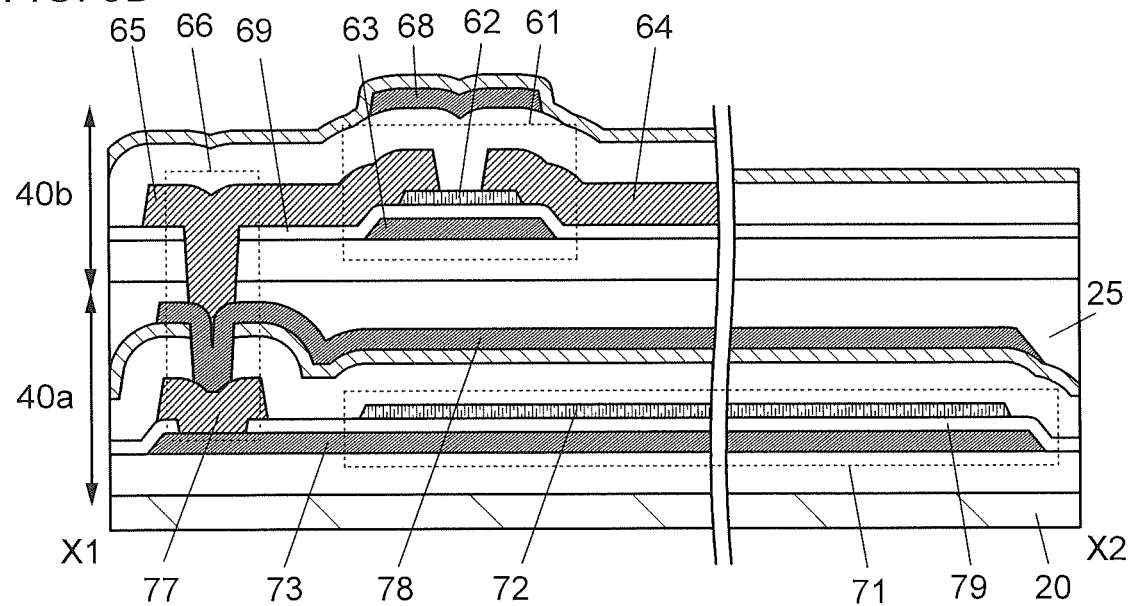

Each of the transistors 61 and 71 may include a conductive layer functioning as a second gate electrode. FIGS. 5A and 5B illustrate a structure in which conductive layers 68 and 78 are provided in the transistors 61 and 71, respectively.

When being supplied with a low potential, the second gate electrode has a function of controlling the threshold voltage of the transistor; when being supplied with the same potential as the front gate electrode of the transistor, the second gate electrode has a function of increasing the on-state current. Here, in order that the transistor 71 may have the latter function, the gate electrode 73 and the conductive layer 78 are electrically connected to each other in the connection portion 66 as illustrated in FIG. 5B. Similarly, the gate electrode 63 and the conductive layer 68 of the transistor 61 are electrically connected to each other in a region (not illustrated).

Figure 6A:
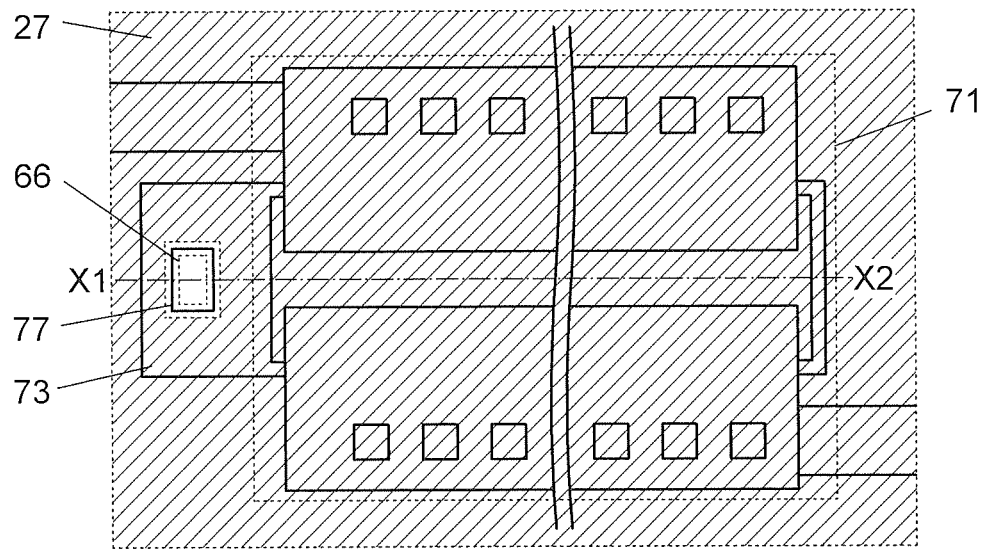
FIGS. 6A and 6B are a top view and a cross-sectional view, respectively, which illustrate a driver circuit.
Figure 6B:
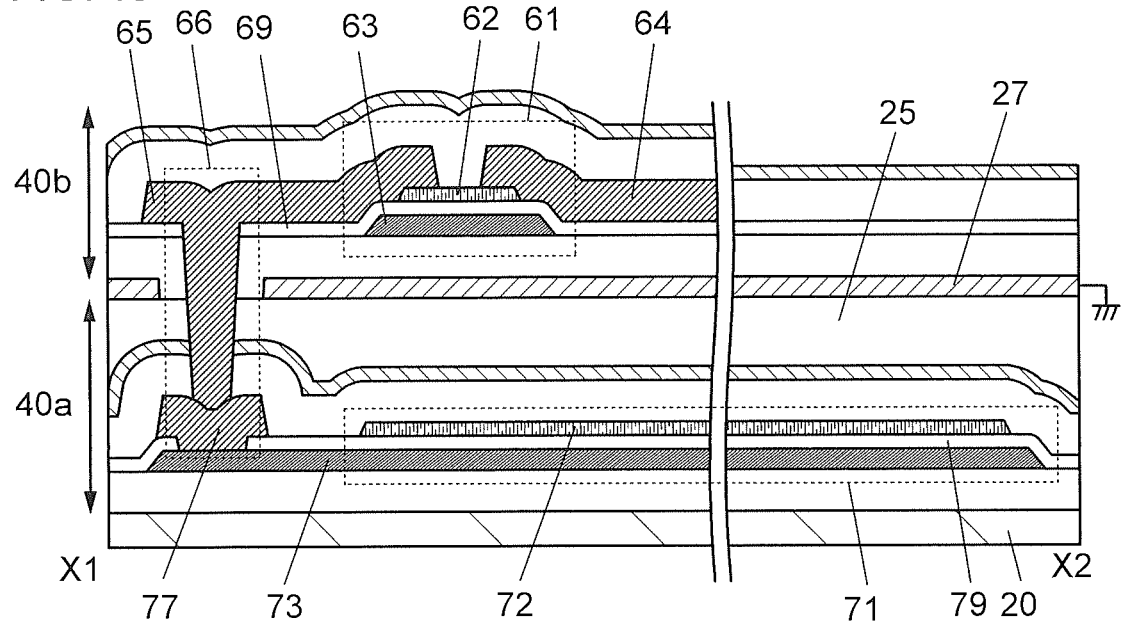

Note that a conductive layer 27 may be provided between the layer 40a and the layer 40b as illustrated in FIGS. 6A and 6B. FIG. 6A is a top view of the transistor 71 and the conductive layer 27 (the transistor 61 is not illustrated), and FIG. 6B is a cross-sectional view along X1-X2 in FIG. 6A (the transistor 61 is illustrated). As illustrated in FIGS. 6A and 6B, the conductive layer 27 is located at a certain distance from the connection portion 66 between the shift register circuit 60 and the buffer circuit 70 so as not to be in contact with the connection portion 66.

The conductive layer 27 functions as a shielding layer for reducing the influence of noise generated in the shift register circuit 60 and the buffer circuit 70. The conductive layer 27 can be formed using Al, Ti, W, or another metal that can be used for a gate electrode, a source electrode, and a drain electrode of a transistor, for example. Alternatively, a conductive metal oxide or the like may be used.

To reduce parasitic capacitance between the conductive layer 27 and the shift register circuit 60 or the buffer circuit 70, the conductive layer 27 is preferably sandwiched between relatively thick interlayer insulating films. By adjusting the thickness of the planarization film 25 functioning as an interlayer insulating film, the conductive layer 27 can also function as a back gate of the transistor included in the layer 40a. Note that a fixed potential is applied to the conductive layer 27. For example, a GND potential or the lowest potential of potentials supplied to the shift register circuit 60 and the buffer circuit 70 is preferably applied.

Figure 7:
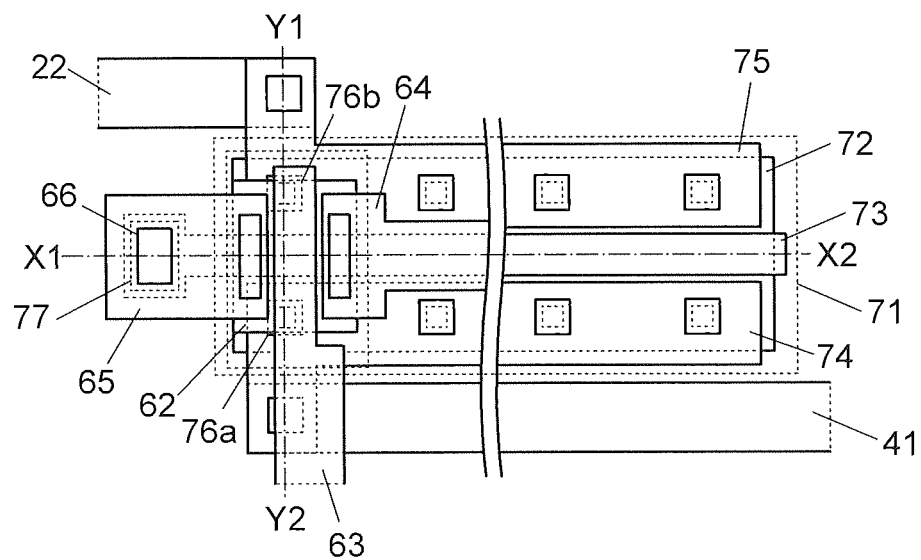
FIG. 7 is a top view illustrating a driver circuit.
Figure 8A:
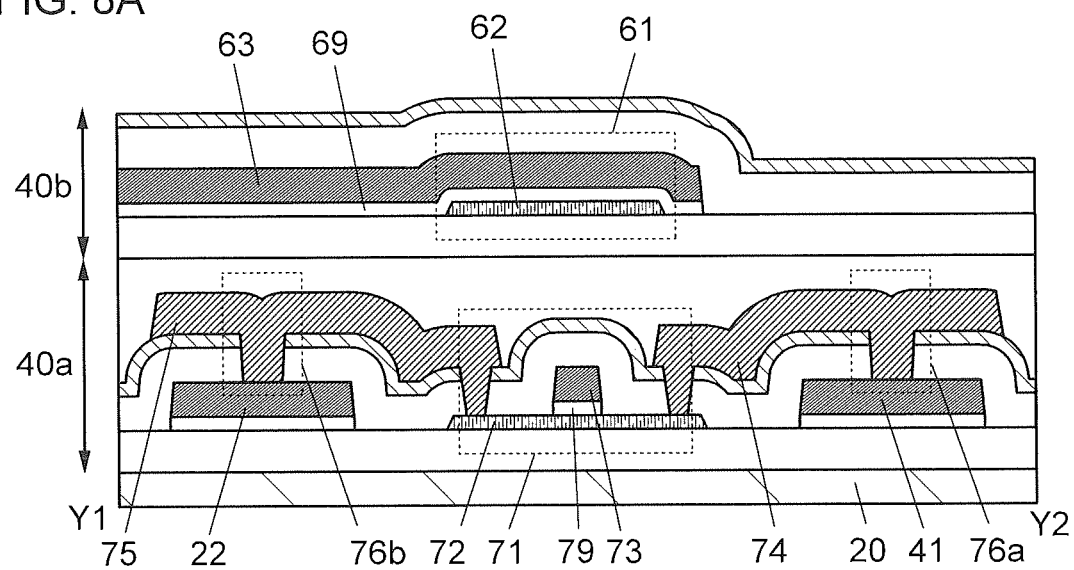
FIGS. 8A and 8B are cross-sectional views illustrating a driver circuit.
Figure 8B:
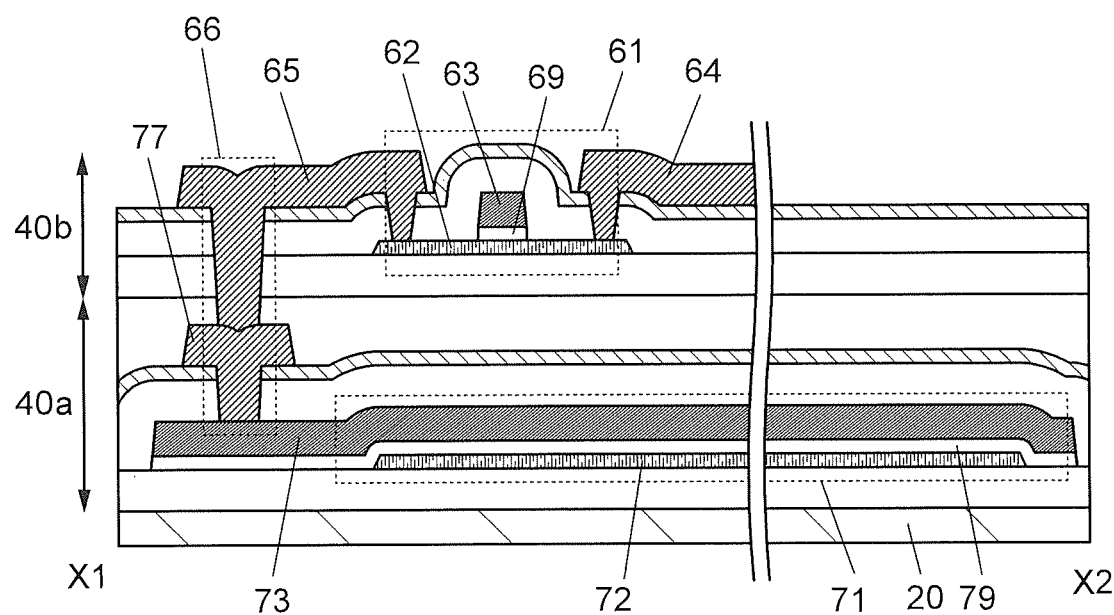
Figure 9A:
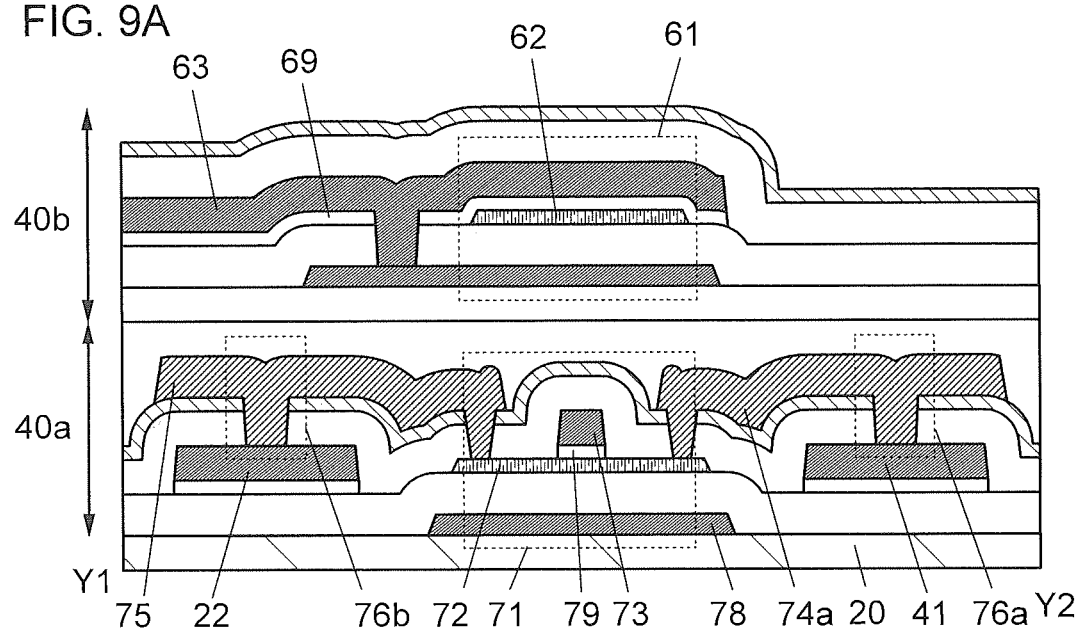
FIGS. 9A and 9B are cross-sectional views illustrating a driver circuit.
Figure 9B:
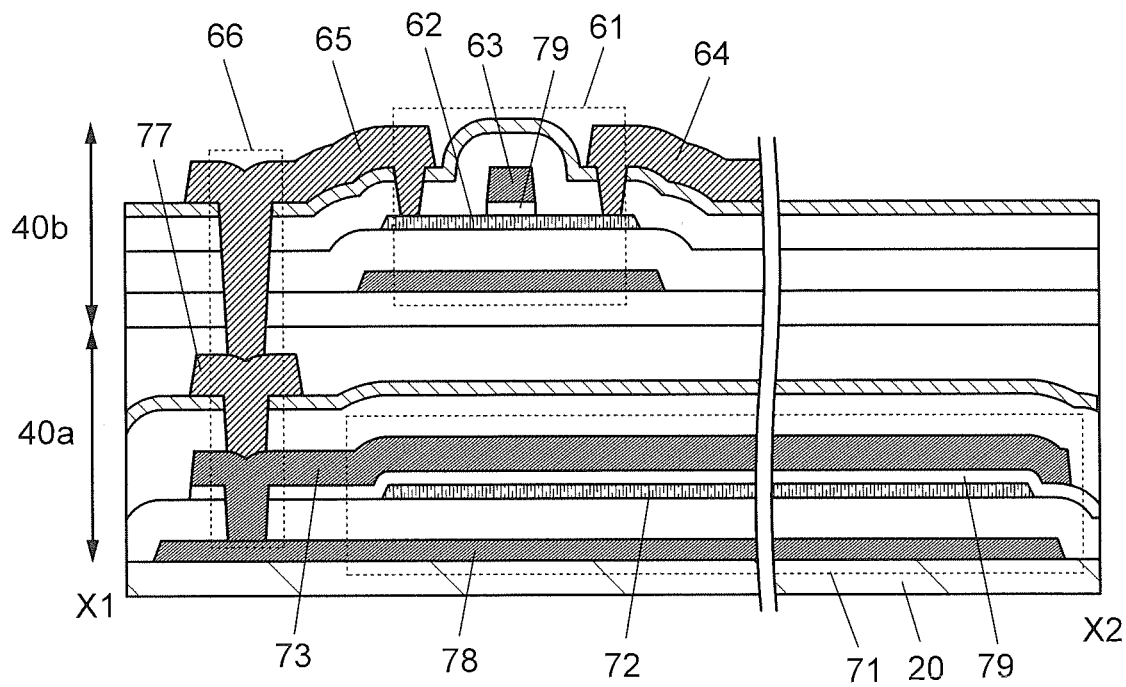

FIG. 7, FIGS. 8A and 8B, and FIGS. 9A and 9B illustrate structures in which the bottom-gate transistors illustrated in FIG. 3, FIGS. 4A and 4B, and FIGS. 5A and 5B are replaced with self-aligned top-gate transistors. FIG. 7 is a top view, FIG. 8A is a cross-sectional view along Y1-Y2 in FIG. 7, and FIG. 8B is a cross-sectional view along X1-X2 in FIG. 7. FIGS. 9A and 9B illustrate a structure in which the transistors 61 and 71 include the conductive layers 68 and 78 functioning as second gate electrodes.

Figure 10A:
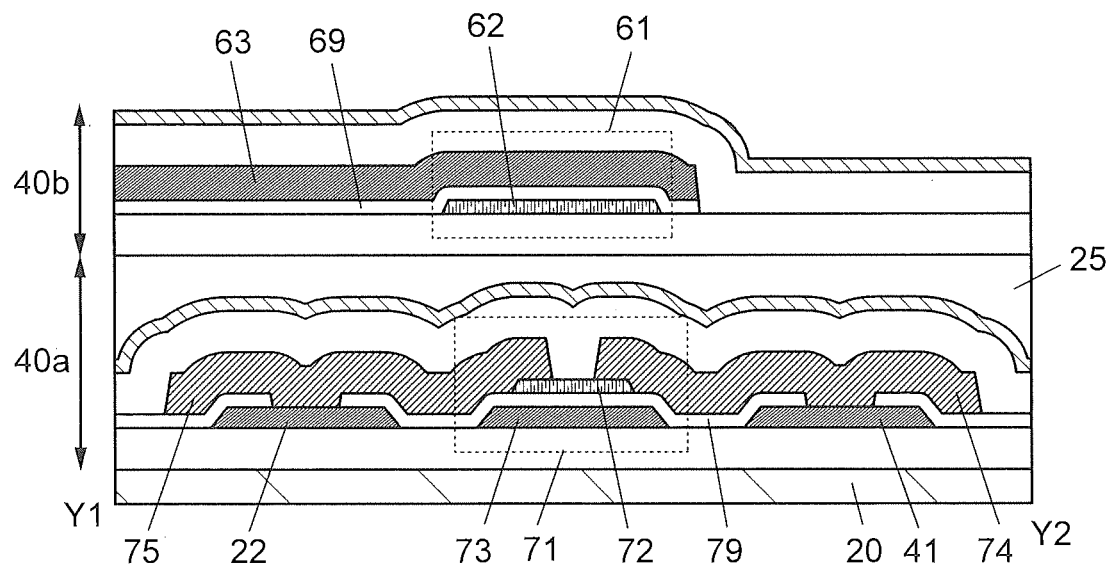
FIGS. 10A and 10B are cross-sectional views illustrating a driver circuit.
Figure 10B:
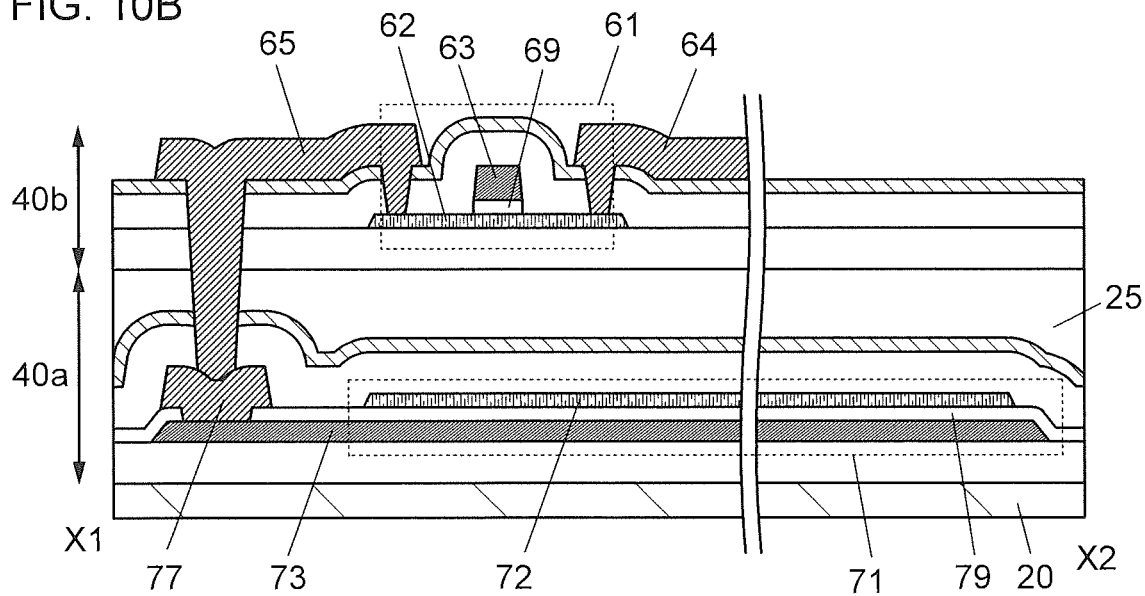
Figure 11A:
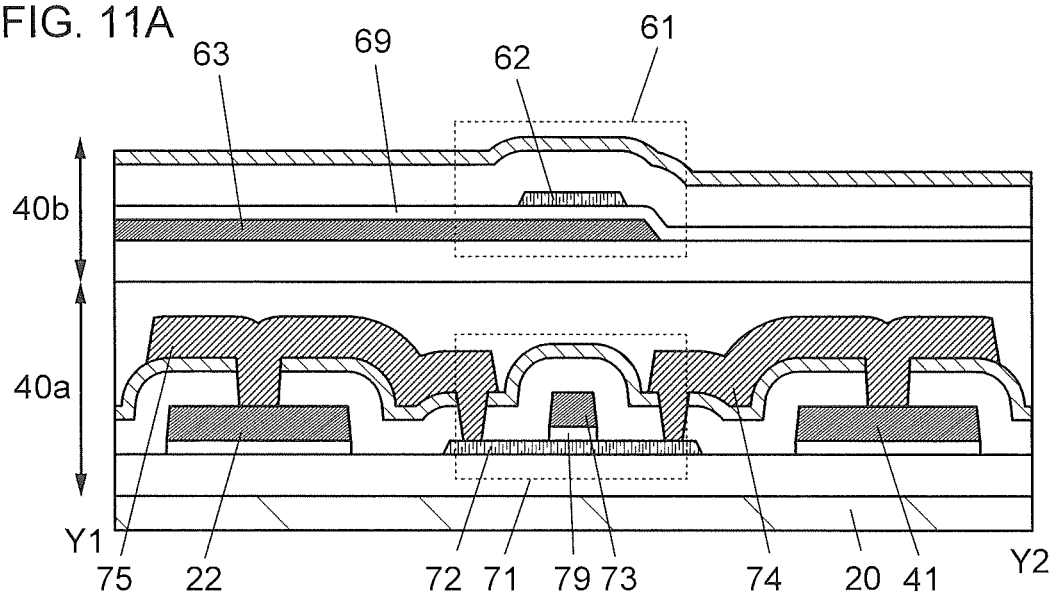
FIGS. 11A and 11B are cross-sectional views illustrating a driver circuit.
Figure 11B:
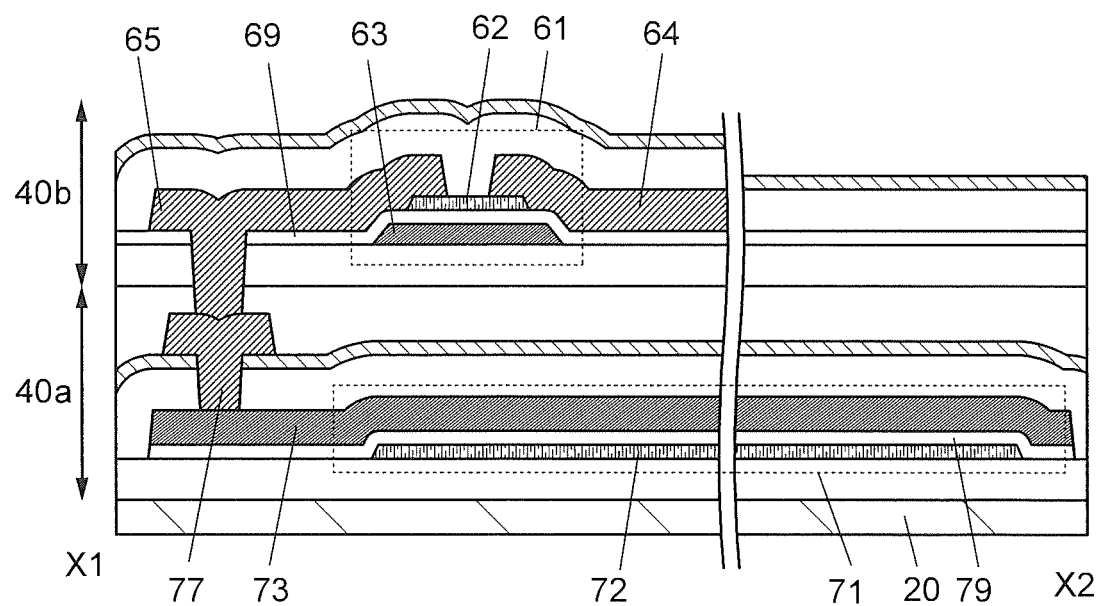

The structures illustrated in FIG. 3, FIGS. 4A and 4B, and FIGS. 5A and 5B and the structures illustrated in FIG. 7, FIGS. 8A and 8B, and FIGS. 9A and 9B may be combined. For example, as illustrated in FIGS. 10A and 10B, the transistor 71 may be a bottom-gate transistor, and the transistor 61 may be a top-gate transistor. Alternatively, as illustrated in FIGS. 11A and 11B, the transistor 61 may be a bottom-gate transistor, and the transistor 71 may be a top-gate transistor.

By employing any of the above structures, the width of a driver circuit such as a gate driver can be narrowed, so that a display device with a narrow bezel can be manufactured.

An oxide semiconductor containing a metal oxide is preferably used for semiconductor layers of semiconductor devices such as the transistors used for the pixel circuit and the driver circuit of the display device. As the oxide semiconductor, for example, a cloud-aligned composite oxide semiconductor (CAC-OS) described later can be used.

In particular, an oxide semiconductor having a wider band gap than silicon is preferably used. When a semiconductor material having a wider band gap and a lower carrier density than silicon is used, the off-state current of the transistor can be reduced.

Charge accumulated in a capacitor through the transistor can be retained for a long time because of its low off-state current. When such a transistor is used for a pixel, the operation of a driver circuit can be stopped while the gray scale of an image displayed in each display region is maintained. As a result, an electronic device with extremely low power consumption can be obtained.

Alternatively, a polycrystalline semiconductor may be used for semiconductor devices such as transistors used for the pixel and the driver circuit which are provided in the display device 10. For example, polycrystalline silicon is preferably used. Polycrystalline silicon can be formed at a lower temperature than single-crystal silicon and has a higher field effect mobility and a higher reliability than amorphous silicon. When such a polycrystalline semiconductor is used for the pixel, the aperture ratio of the pixel can be improved. Even in the case where a very large number of pixels are provided, a gate driver circuit and a source driver circuit can be formed over the same substrate as the pixels, so that the number of components of an electronic device can be reduced.

At least part of this embodiment can be implemented in combination with any of the other embodiments described in this specification as appropriate.

Embodiment 2

In this embodiment, a driver circuit of a display device that can be used for one embodiment of the present invention will be described with reference to FIGS. 12A to 12C.

The driver circuit of the display device described in this embodiment includes a shift register circuit and a buffer circuit. Note that the buffer circuit is included in the shift register circuit in some cases.

Figure 12A:
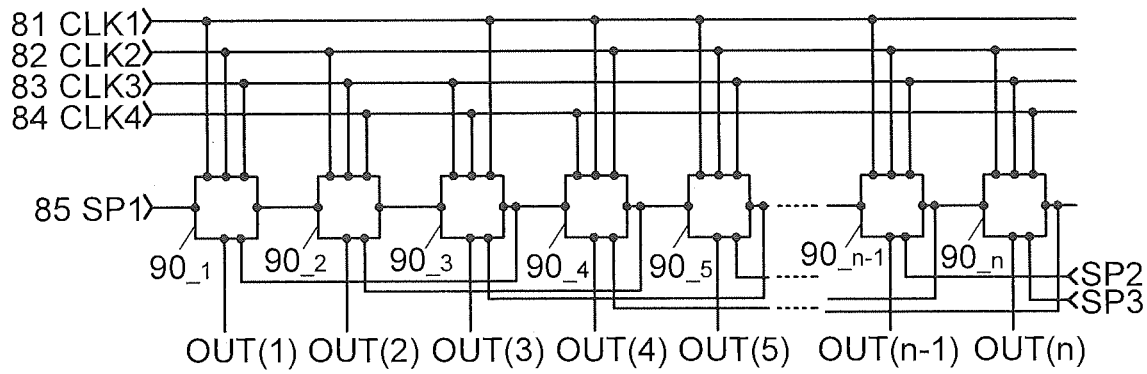
FIGS. 12A and 12B are block diagrams illustrating a driver circuit.

The shift register circuit described in this embodiment includes pulse signal output circuits 90 (90$_{-1}$ to 90$_{-n}$; n is a natural of 2 or more) and signal lines 81 to 84 which transmit clock signals (see FIG. 12A). A clock signal CLK1 is supplied to the signal line 81. A clock signal CLK2 is supplied to the signal line 82. A clock signal CLK3 is supplied to the signal line 83. A clock signal CLK4 is supplied to the signal line 84.

A clock signal is a signal that alternates between an H signal (high potential) and an L signal (low potential) at regular intervals. Here, the clock signals CLK1 to CLK4 are sequentially delayed by ¼ period. In this embodiment, for example, the control of the pulse signal output circuits 90 is performed using the clock signals.

Figure 12B:
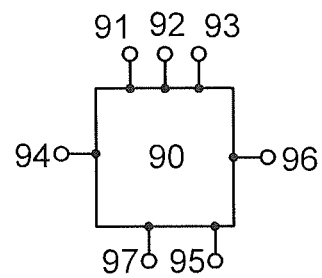

Each of the pulse signal output circuits 90 includes an input terminal 91, an input terminal 92, an input terminal 93, an input terminal 94, an input terminal 95, an output terminal 96, and an output terminal 97 (see FIG. 12B).

The input terminals 91 to 93 are electrically connected to any of the signal lines 81 to 84. For example, regarding the pulse signal output circuit 90$_{-1}$, the input terminal 91 is electrically connected to the signal line 81, the input terminal 92 is electrically connected to the signal line 82, and the input terminal 93 is electrically connected to the signal line 83. Regarding the pulse signal output circuit 90$_{-2}$, the input terminal 91 is electrically connected to the signal line 82, the input terminal 92 is electrically connected to the signal line 83, and the input terminal 93 is electrically connected to the signal line 84. Note that the case where the signal lines 82 to 84 are connected to the pulse signal output circuit 90$_{-n}$ is described here. However, which signal lines are connected to the pulse signal output circuit 90$_{-n}$ depends on the value of n. Thus, the configuration described herein is just an example.

Regarding the pulse signal output circuit 90$_{-n}$ (n is a natural number of 2 or more) of the shift register described in this embodiment, the input terminal 94 is electrically connected to the output terminal 96 of the pulse signal output circuit 90$_{m-1}$, the input terminal 95 is electrically connected to the output terminal 96 of the pulse signal output circuit 90$_{-m+2}$, the output terminal 96 is electrically connected to the input terminal 94 of the pulse signal output circuit 90$_{-m+1}$, and the output terminal 97 outputs a signal to OUT(m).

For example, regarding the pulse signal output circuit 90$_{-3}$, the input terminal 94 is electrically connected to the output terminal 96 of the pulse signal output circuit 90$_{-2}$, the input terminal 95 is electrically connected to the output terminal 96 of the pulse signal output circuit 90$_{-5}$, and the output terminal 96 is electrically connected to the input terminal 94 of the pulse signal output circuit 90$_{-4}$ and the input terminal 95 of the pulse signal output circuit 90$_{-1}$.

In addition, a start pulse (SP1) is input from a wiring 85 to the input terminal 94 of the pulse signal output circuit 90$_{-1}$. A pulse output from the previous stage is input to the input terminal 94 of the pulse signal output circuit 90$_{-k}$ (k is a natural number greater than or equal to 2 and less than or equal to n). A start pulse (SP2) is input to the input terminal 95 of the pulse signal output circuit 90$_{-(n-1)}$. A start pulse (SP3) is input to the input terminal 95 of the pulse signal output circuit 90$_{-n}$. The start pulse (SP2) and the start pulse (SP3) may be input from the outside or generated inside the circuit.

Next, a specific configuration of the pulse signal output circuits 90$_{-1}$ to 90$_{-n}$ will be described.

Figure 12C:
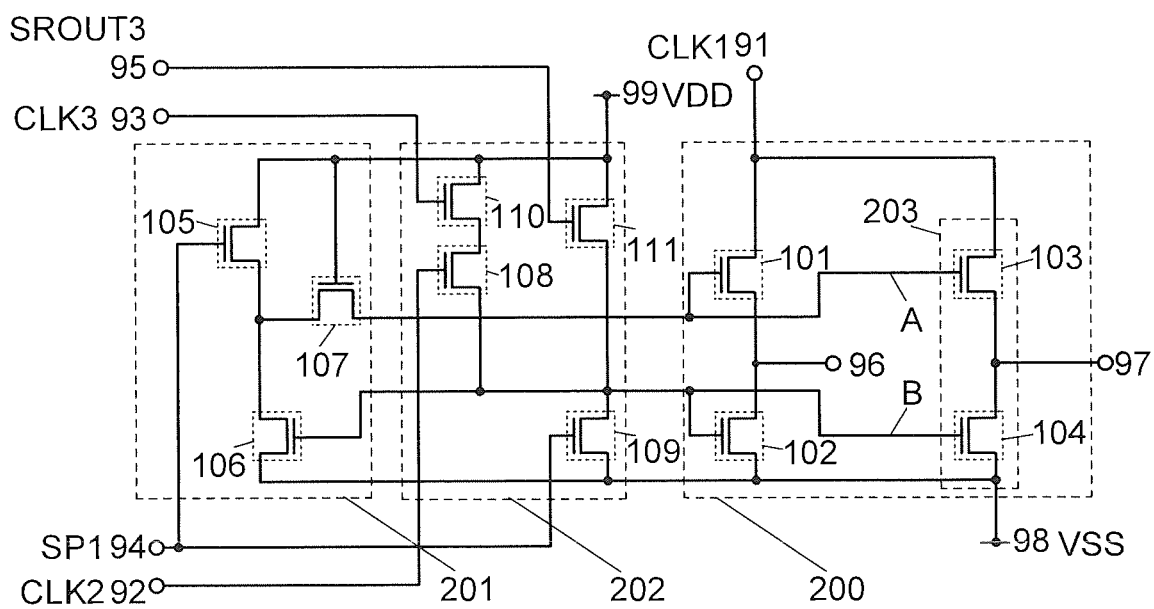
FIG. 12C is a circuit diagram illustrating the driver circuit.

Each of the pulse signal output circuits 90$_{-1}$ to 90$_{-n}$ includes a pulse signal generation circuit 200 including transistors 101 to 104, an input signal generation circuit 201 including transistors 105 to 107, and an input signal generation circuit 202 including transistors 108 to 111 (see FIG. 12C). The transistors 101 to 111 are supplied with signals from a power supply line 98 and a power supply line 99 as well as from the above-described input terminals 91 to 95.

Note that the transistors 103 and 104 included in the pulse signal generation circuit 200 serve as a buffer circuit 203. The buffer circuit 203 corresponds to the buffer circuit 70 described in Embodiment 1 with reference to FIGS. 2B to 2E and the like. The pulse signal generation circuit 200 (except for the buffer circuit 203), the input signal generation circuit 201, and the input signal generation circuit 202 correspond to the shift register circuit 60.

That is, the transistor 61 described in Embodiment 1 with reference to FIG. 3 and the like corresponds to the transistor 106, the transistor 107, the transistor 108, or the transistor 109. The transistor 71 corresponds to the transistor 103 or the transistor 104.

A specific configuration example of the pulse signal generation circuit 200 is as follows.

A first terminal (one of a source terminal and a drain terminal; the same applies below) of the transistor 101, a first terminal of the transistor 102, and the output terminal 96 are electrically connected to one another. Similarly, a first terminal of the transistor 103, a first terminal of the transistor 104, and the output terminal 97 are electrically connected to one another. A gate terminal of the transistor 101, a gate terminal of the transistor 103, and an output terminal of the input signal generation circuit 201 are electrically connected to one another. A gate terminal of the transistor 102, a gate terminal of the transistor 104, and an output terminal of the input signal generation circuit 202 are electrically connected to one another.

A second terminal (the other of the source terminal and the drain terminal; the same applies below) of the transistor 101 and a second terminal of the transistor 103 are electrically connected to each other, and the clock signal CLK1 is input to the node therebetween. The second terminal of the transistor 101 and the second terminal of the transistor 103 also function as the input terminal 91 of the pulse signal output circuit 90. A first potential (e.g., a low potential $V_{SS}$) is supplied to a second terminal of the transistor 102 through the power supply line 98. The first potential is supplied to a second terminal of the transistor 104 through the power supply line 98.

A specific configuration example of the input signal generation circuit 201 is as follows.

A first terminal of the transistor 105, a first terminal of the transistor 106, and a first terminal of the transistor 107 are electrically connected to one another. A second terminal of the transistor 107 functions as the output terminal of the input signal generation circuit 201. A gate terminal of the transistor 105 functions both as a first input terminal of the input signal generation circuit 201 and as the input terminal 94 of the pulse signal output circuit 90.

A second potential is supplied to a second terminal of the transistor 105 through the power supply line 99. The first potential is supplied to a second terminal of the transistor 106 through the power supply line 98. A pulse signal of the previous stage (which corresponds to a start pulse signal in the pulse signal output circuit 90 of the first stage) is input to the gate terminal of the transistor 105. An output signal of the input signal generation circuit 202 is input to a gate terminal of the transistor 106. The gate terminal of the transistor 106 functions as a second input terminal of the input signal generation circuit 201. The second potential is supplied to a gate terminal of the transistor 107 through the power supply line 99.

Although the transistor 107 is provided in this embodiment, a configuration without the transistor 107 may also be employed. The transistor 107 can suppress a potential rise at the first terminal of the transistor 105, which might be caused by bootstrap operation. That is, a high voltage can be prevented from being applied to a region between the gate and the source (or between the gate and the drain) of the transistor 105; thus, deterioration of the transistor 105 can be suppressed.

A specific configuration example of the input signal generation circuit 202 is as follows.

A second terminal of the transistor 110 and a first terminal of the transistor 108 are electrically connected to each other. A second terminal of the transistor 108, a second terminal of the transistor 111, and a first terminal of the transistor 109 are electrically connected to one another and function as the output terminal of the input signal generation circuit 202.

The second potential is supplied to a first terminal of the transistor 111 and a first terminal of the transistor 110 through the power supply line 99. The first potential is supplied to a second terminal of the transistor 109 through the power supply line 98. A pulse signal of the second subsequent stage is input to a gate terminal of the transistor 111. The gate terminal of the transistor 111 functions both as a first input terminal of the input signal generation circuit 202 and as the input terminal 95 of the pulse signal output circuit 90. The clock signal CLK2 is input to a gate terminal of the transistor 108. The gate terminal of the transistor 108 functions both as a second input terminal of the input signal generation circuit 202 and as the input terminal 92 of the pulse signal output circuit 90. The pulse signal of the previous stage (which corresponds to the start pulse signal in the pulse signal output circuit 90 of the first stage) is input to a gate terminal of the transistor 109. The gate terminal of the transistor 109 functions both as a third input terminal of the input signal generation circuit 202 and as the input terminal 94 of the pulse signal output circuit 90. The clock signal CLK3 is input to a gate terminal of the transistor 110. The gate terminal of the transistor 110 functions both as a fourth input terminal of the input signal generation circuit 202 and as the input terminal 93 of the pulse signal output circuit 90.

Note that the above-described configuration of the pulse signal output circuit 90 (e.g., configuration examples of the pulse signal generation circuit 200, the input signal generation circuit 201, and the input signal generation circuit 202) is just an example, and the invention disclosed herein is not limited thereto.

In the following description of this embodiment, a node where the gate terminal of the transistor 101, the gate terminal of the transistor 103, and the output terminal of the input signal generation circuit 201 are connected to one another in the pulse signal output circuit 90 in FIG. 12C is referred to as a node A. In addition, a node where the gate terminal of the transistor 102, the gate terminal of the transistor 104, and the output terminal of the input signal generation circuit 202 are connected to one another is referred to as a node B.

A capacitor suitable for bootstrap operation may be provided between the node A and the output terminal 96. Furthermore, a capacitor electrically connected to the node B may be provided to hold the potential of the node B.

An oxide semiconductor containing a metal oxide is preferably used for the transistors 101 to 111. With the use of an oxide semiconductor, the off-state current of the transistors can be reduced. Furthermore, the on-state current and the field-effect mobility can be increased as compared with those in the case where amorphous silicon or the like is used. Furthermore, deterioration of the transistors can be suppressed. Thus, a low-power electronic circuit which can operate at high speed with higher accuracy is obtained.

At least part of this embodiment can be implemented in combination with any of the other embodiments described in this specification as appropriate.

Embodiment 3

In this embodiment, a display device that can be used for one embodiment of the present invention and a method for driving the display device will be described.

The display device of one embodiment of the present invention can include a pixel provided with a first display element that reflects visible light, a pixel provided with a second display element that emits visible light, a pixel provided with a third display element that transmits visible light, or a pixel provided with the first display element and the second display element or the third display element.

In this embodiment, a display device including the first display element that reflects visible light and the second display element that emits visible light will be described.

The display device has a function of displaying an image utilizing first light reflected from the first display element and/or second light emitted from the second display element. Alternatively, the display device has a function of expressing gray scales by individually controlling the amount of the first light reflected from the first display element and the amount of the second light emitted from the second display element.

The display device preferably includes a first pixel that expresses gray scales by controlling the amount of light reflected from the first display element and a second pixel that expresses gray scales by controlling the amount of light emitted from the second display element. For example, the first pixels and the second pixels are arranged in a matrix to form a display portion.

It is preferable that the first pixels and the second pixels be the same in number and be arranged with the same pitch in a display region. Here, the adjacent first and second pixels can be collectively referred to as a pixel unit. Accordingly, as described later, an image displayed by only a plurality of first pixels, an image displayed by only a plurality of second pixels, and an image displayed by both the plurality of first pixels and the plurality of second pixels can be displayed in the same display region.

As the first display element included in the first pixel, an element that performs display by reflecting external light can be used. Such an element does not include a light source, and thus, the power consumption for display can be significantly reduced.

As the first display element, typically, a reflective liquid crystal element can be used. Alternatively, as the first display element, a microelectromechanical systems (MEMS) shutter element, an optical interference type MEMS element, an element to which a microcapsule method, an electrophoretic method, an electrowetting method, an Electronic Liquid Powder (registered trademark) method, or the like is applied, or the like can be used.

As the second display element included in the second pixel, an element that performs display by utilizing light from its own light source can be used. Specifically, it is preferable to use an electroluminescent element in which light emission can be extracted from a light-emitting substance by application of an electric field. Since the luminance and the chromaticity of light emitted from such a pixel are not affected by external light, display with high color reproducibility (a wide color gamut) and high contrast can be performed; that is, a clear image can be displayed.

As the second display element, a self-luminous light-emitting element such as an organic light-emitting diode (OLED), an LED, a quantum-dot LED (QLED), or a semiconductor laser can be used. Alternatively, a combination of a backlight that serves as a light source and a transmissive liquid crystal element that controls the amount of light from the backlight transmitted therethrough may be used as the display element included in the second pixel.

The first pixel can include, for example, a subpixel exhibiting white (W) or subpixels each exhibiting light of corresponding one of three colors, red (R), green (G), and blue (B). Similarly, the second pixel can include, for example, a subpixel exhibiting white (W) or subpixels each exhibiting light of corresponding one of three colors, red (R), green (G), and blue (B). Note that the first pixel and the second pixel may each include subpixels of four or more colors. As the number of kinds of subpixels is increased, the power consumption can be reduced and the color reproducibility can be improved.

In one embodiment of the present invention, the display mode can be switched between a first mode in which an image is displayed by the first pixels, a second mode in which an image is displayed by the second pixels, and a third mode in which an image is displayed by the first pixels and the second pixels.

In the first mode, an image is displayed using light reflected from the first display element. The first mode, which requires no light source, is a driving mode with extremely low power consumption. For example, the first mode is effective in the case where external light is white or near-white light with sufficiently high illuminance. The first mode is a display mode suitable for displaying text data of a book, a document or the like. The use of reflected light enables eye-friendly display, thereby mitigating eye strain.

In the second mode, an image is displayed utilizing light emitted from the second display element. Thus, an extremely clear image can be displayed (display with high contrast and high color reproducibility can be performed) regardless of the illuminance and the chromaticity of external light. For example, the second mode is effective when the illuminance of external light is extremely low, e.g., during the night or in a dark room. When a bright image is displayed under weak external light, a user may feel that the image is too bright. To prevent this, an image with reduced luminance is preferably displayed in the second mode. Thus, excessive brightness can be suppressed, and the power consumption can be reduced. The second mode is suitable for displaying a clear image, a smooth moving image, or the like.

In the third mode, display is performed utilizing both light reflected from the first display element and light emitted from the second display element. Specifically, in the driving mode, light from the first pixel and light from the second pixel adjacent to the first pixel are mixed to express one color. An image can be displayed more clearly than in the first mode, and the power consumption can be lower than that in the second mode. For example, the third mode is effective when the illuminance of external light is relatively low, e.g., under indoor illumination or in the morning or evening, or when the external light does not represent a white chromaticity. Furthermore, the mixed light of reflected light and emitted light makes it possible to display an image that gives a viewer an impression as if he or she saw a painting.

A more specific example of one embodiment of the present invention will be described below with reference to drawings.

[Structure Example of Display Device]

Figure 13A:
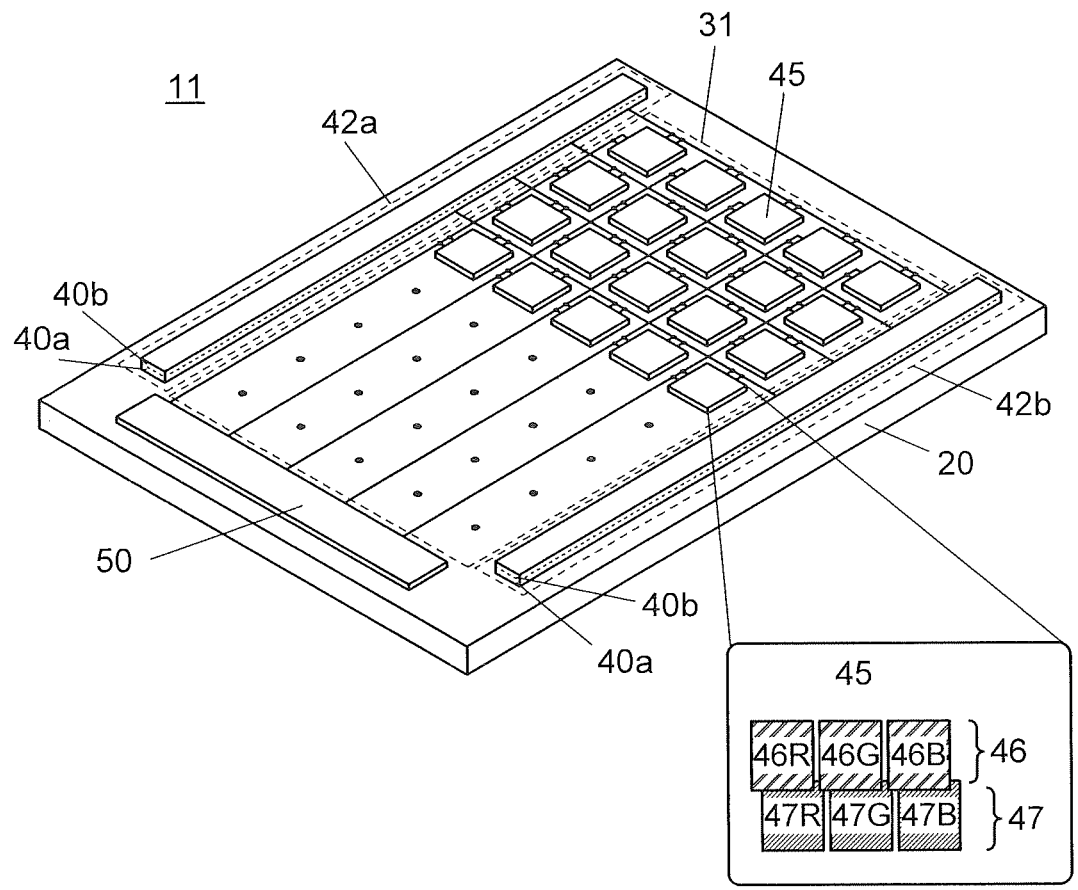
FIGS. 13A to 13C illustrate structures of a display device.

FIG. 13A illustrates a display device 11 of one embodiment of the present invention. The display device 11 includes the display portion 31, a driver circuit 42a, a driver circuit 42b, and the driver circuit 50. Moreover, the display device 11 may include a photometric portion for obtaining the illuminance of external light or the like.

The display portion 31 includes a plurality of pixel units 45 arranged in a matrix. The pixel unit 45 includes a first pixel circuit 46 and a second pixel circuit 47.

FIG. 13A shows an example in which the first pixel circuit 46 and the second pixel circuit 47 each include display elements corresponding to three colors of red (R), green (G), and blue (B).

The first pixel circuit 46 includes a display element 46R corresponding to red (R), a display element 46G corresponding to green (G), and a display element 46B corresponding to blue (B). The display elements 46R, 46G, and 46B utilize reflection of external light.

The second pixel circuit 47 includes a display element 47R corresponding to red (R), a display element 47G corresponding to green (G), and a display element 47B corresponding to blue (B). The display elements 47R, 47G, and 47B each utilize light from a light source.

The driver circuits 42a, 42b, and 50 include circuits for driving the plurality of pixel units 45 in the display portion 31. Specifically, a signal including a gray level, a scan signal, a power supply potential, and the like are supplied to the first pixel circuit 46 and the second pixel circuit 47 included in the pixel unit 45. The driver circuit 42a can serve as, for example, a gate driver for driving the first pixel circuit 46. The driver circuit 42b can serve as, for example, a gate driver for selecting the second pixel circuit 47. The driver circuit 50 can serve as, for example, a source driver for inputting a video signal to the selected first pixel circuit 46 and the selected second pixel circuit 47.

Note that, like the driver circuit 40 described in Embodiment 1, each of the driver circuits 42a and 42b includes a shift register circuit formed in one of the layers 40a and 40b and a buffer circuit formed in the other of the layers 40a and 40b.

Figure 13B:
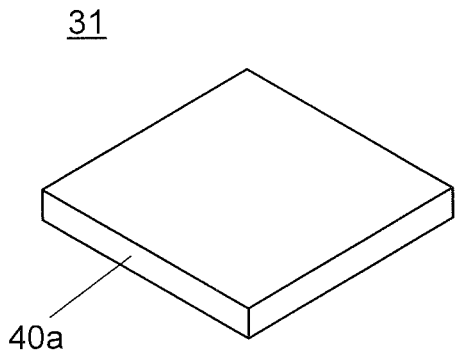
Figure 13C:
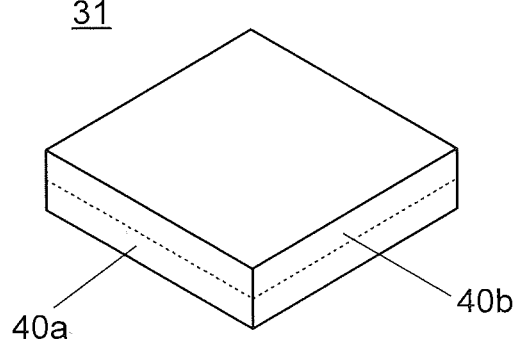

As illustrated in FIG. 13B, the pixel unit 45 can be provided in the layer 40a. Alternatively, as illustrated in FIG. 13C, the pixel unit 45 can be provided in the layer 40a and the layer 40b. In the latter case, one of the first pixel circuit 46 and the second pixel circuit 47 can be provided in the layer 40a, and the other of the first pixel circuit 46 and the second pixel circuit 47 can be provided in the layer 40b. In this case, a transistor included in the first pixel circuit 46 can be provided in one of the layers 40a and 40b. Furthermore, a first transistor included in the second pixel circuit 47 can be provided in the layer 40a, a second transistor included in the second pixel circuit 47 can be provided in the layer 40b, and the second transistor can have a region overlapping with the first transistor. In such a structure, the area occupied by the transistors can be reduced, whereby the pixel density can be easily increased.

The above is the description of the structure example of the display device.

[Structure Example of Pixel Unit]

Figure 14A:
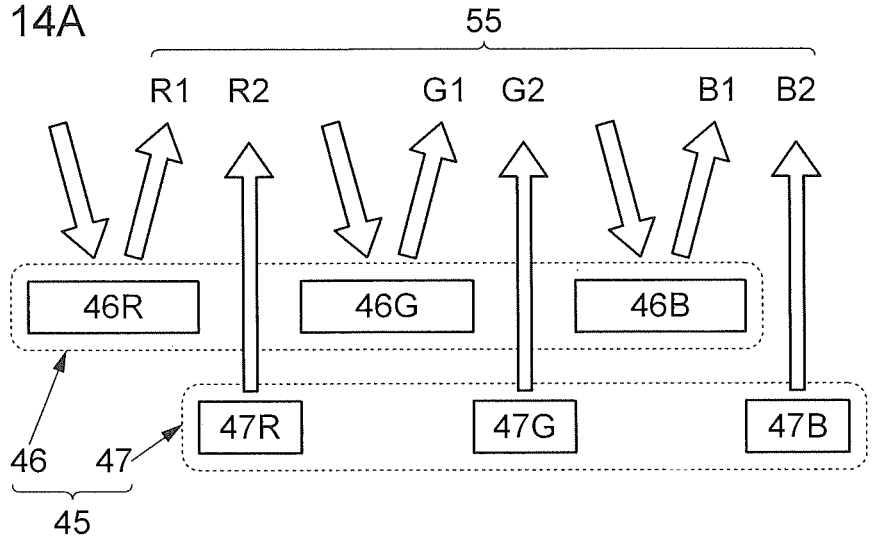
FIGS. 14A to 14C illustrate a pixel unit.
Figure 14B:
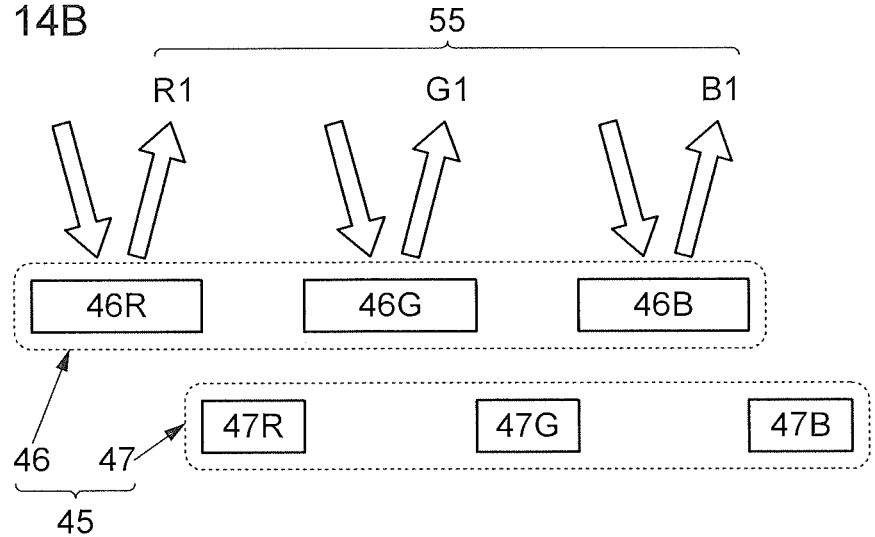
Figure 14C:
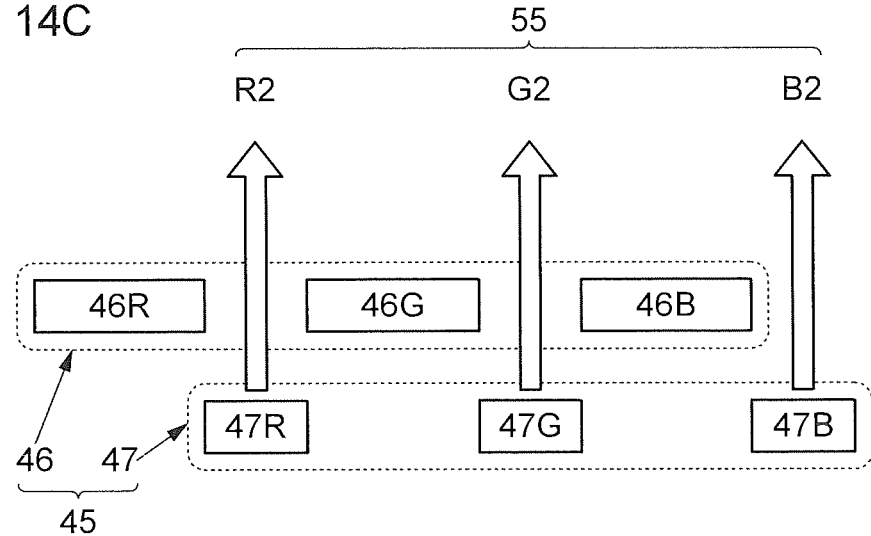

Next, the pixel unit 45 will be described with reference to FIGS. 14A to 14C. FIGS. 14A to 14C are schematic views illustrating structure examples of the pixel unit 45.

The first pixel circuit 46 includes the display element 46R, the display element 46G, and the display element 46B. The display element 46R reflects external light, which is then extracted to the display surface side as red light R1 with a luminance corresponding to the gray level of red included in a first gray level input to the first pixel circuit 46. Similarly, green light G1 and blue light B1 are extracted from the display element 46G and the display element 46B, respectively, to the display surface side.

The second pixel circuit 47 includes the display element 47R, the display element 47G, and the display element 47B. The display element 47R includes a light source and emits, to the display surface side, red light R2 with a luminance corresponding to the gray level of red included in a second gray level input to the second pixel circuit 47. Similarly, the display element 47G and the display element 47B emit green light G2 and blue light B2, respectively, to the display surface side.

[Third Mode]

FIG. 14A shows an example of an operation mode in which an image is displayed by driving both the display elements 46R, 46G, and 46B, which reflect external light, and the display elements 47R, 47G, and 47B, which emit light. As illustrated in FIG. 14A, the six colors of the light, i.e., the light R1, the light G1, the light B1, the light R2, the light G2, and the light B2 are mixed, whereby light 55 of a predetermined color can be extracted from the pixel unit 45 to the display surface side.

At this time, the luminance of each of the display elements 47R, 47G, and 47B is preferably low. For example, when the maximum value of the luminance of light that can be emitted from each of the display elements 47R, 47G, and 47B is referred to as highest luminance, the maximum value of the luminance of light emitted from each of the display elements 47R, 47G, and 47B in the third mode is preferably greater than or equal to 5% and less than or equal to 50%, further preferably greater than or equal to 1% and less than or equal to 60% of the highest luminance. Accordingly, an image can be displayed with low power consumption, the displayed image can become more like a painting, and eye-friendly display can be performed.

[First Mode]

FIG. 14B shows an example of an operation mode in which an image is displayed by driving the display elements 46R, 46G, and 46B, which reflect external light. As illustrated in FIG. 14B, for example, in the case where the illuminance of external light is sufficiently high, the second pixel circuit 47 is not driven and only the colors of the light (the light R1, the light G1, and the light B1) from the first pixel circuit 46 are mixed, whereby the light 55 of a predetermined color can be extracted from the pixel unit 45 to the display surface side. Thus, driving with extremely low power consumption can be performed.

[Second Mode]

FIG. 14C shows an example of an operation mode in which an image is displayed by driving the display elements 47R, 47G, and 47B. As illustrated in FIG. 14C, for example, in the case where the illuminance of external light is extremely low, the first pixel circuit 46 is not driven and only the colors of the light (the light R2, the light G2, and the light B2) from the second pixel circuit 47 are mixed, whereby the light 55 of a predetermined color can be extracted from the pixel unit 45 to the display surface side. Thus, a clear image can be displayed. Furthermore, the luminance is reduced when the illuminance of external light is low, which can prevent glare for a user and reduce power consumption.

In this mode, the luminance of the display elements that emit visible light is preferably higher than that in the third mode. For example, the maximum value of the luminance of light emitted from each of the display elements 47R, 47G, and 47B in the second mode can be 100% of the highest luminance, or greater than or equal to 50% and less than or equal to 100%, preferably greater than or equal to 60% and less than or equal to 100% of the highest luminance. Accordingly, a clear image can be displayed even in a place with bright external light.

Here, the maximum value of the luminance of light emitted from each of the display elements 47R, 47G, and 47B can be regarded as a dynamic range. That is, the dynamic range of each of the display elements 47R, 47G, and 47B in the third mode can be set to be narrower than that in the second mode. For example, the dynamic range of the display element 47R, the display element 47G, or the display element 47B in the third mode can be set to greater than or equal to 5% and less than or equal to 50%, preferably greater than or equal to 1% and less than or equal to 60% of the dynamic range in the second mode.

The above is the description of the structure example of the pixel unit 45.

At least part of this embodiment can be implemented in combination with any of the other embodiments described in this specification as appropriate.

Embodiment 4

An example of a display panel which can be used for a display device of one embodiment of the present invention will be described below. The display panel exemplified below includes both a reflective liquid crystal element and a light-emitting element and can perform display both in a transmissive mode and in a reflective mode.

Configuration Example

FIG. 15A is a block diagram showing a configuration example of a display device 400. The display device 400 includes a plurality of pixels 410 arranged in a matrix in a display portion 362. Furthermore, the display device 400 includes a circuit GD and a circuit SD. Furthermore, the display device 400 includes a plurality of wirings G1, a plurality of wirings G2, a plurality of wirings ANO, and a plurality of wirings CSCOM which are electrically connected to the circuit GD and the plurality of pixels 410 arranged in the direction R. Furthermore, the display device 400 includes a plurality of wirings 51 and a plurality of wirings S2 which are electrically connected to the circuit SD and the plurality of pixels 410 arranged in the direction C.

Although one circuit GD and one circuit SD are provided here for simplicity, the circuit GD and the circuit SD for driving a liquid crystal element and the circuit GD and the circuit SD for driving a light-emitting element may be separately provided.

The pixel 410 includes a reflective liquid crystal element and a light-emitting element. In the pixel 410, the liquid crystal element and the light-emitting element partly overlap with each other.

FIG. 15B1 shows a configuration example of a conductive layer 311b included in the pixel 410. The conductive layer 311b functions as a reflective electrode of the liquid crystal element in the pixel 410. The conductive layer 311b has an opening 451.

The dashed line in FIG. 15B1 denotes a light-emitting element 360 positioned in a region overlapping with the conductive layer 311b. The light-emitting element 360 overlaps with the opening 451 of the conductive layer 311b. Thus, light emitted from the light-emitting element 360 is extracted to the display surface side through the opening 451.

In FIG. 15B1, the pixels 410 adjacent in the direction R are pixels of different colors. As illustrated in FIG. 15B1, the openings 451 in two pixels adjacent in the direction R are preferably provided in different positions in the conductive layers 311b so as not to be arranged in a line. This allows two adjacent light-emitting elements 360 to be apart from each other, thereby preventing light emitted from the light-emitting element 360 from entering a coloring layer included in the adjacent pixel 410 (such a phenomenon is also referred to as crosstalk). Furthermore, since two adjacent light-emitting elements 360 can be arranged apart from each other, a high-resolution display device can be obtained even when EL layers of the light-emitting elements 360 are separately formed with a blocking mask or the like.

Alternatively, the arrangement illustrated in FIG. 15B2 may be employed.

If the ratio of the total area of the opening 451 to the total area excluding the opening is too large, display performed using the liquid crystal element is dark. If the ratio of the total area of the opening 451 to the total area excluding the opening is too small, display performed using the light-emitting element 360 is dark.

If the area of the opening 451 of the conductive layer 311b functioning as a reflective electrode is too small, the extraction efficiency of light emitted from the light-emitting element 360 is decreased.

The opening 451 may have a polygonal shape, a quadrangular shape, an elliptical shape, a circular shape, a cross-like shape, a stripe shape, a slit shape, or a checkered pattern, for example. The opening 451 may be provided close to the adjacent pixel. The opening 451 is preferably provided close to another pixel displaying the same color, in which case crosstalk can be suppressed.

Circuit Configuration Example

Figure 16:
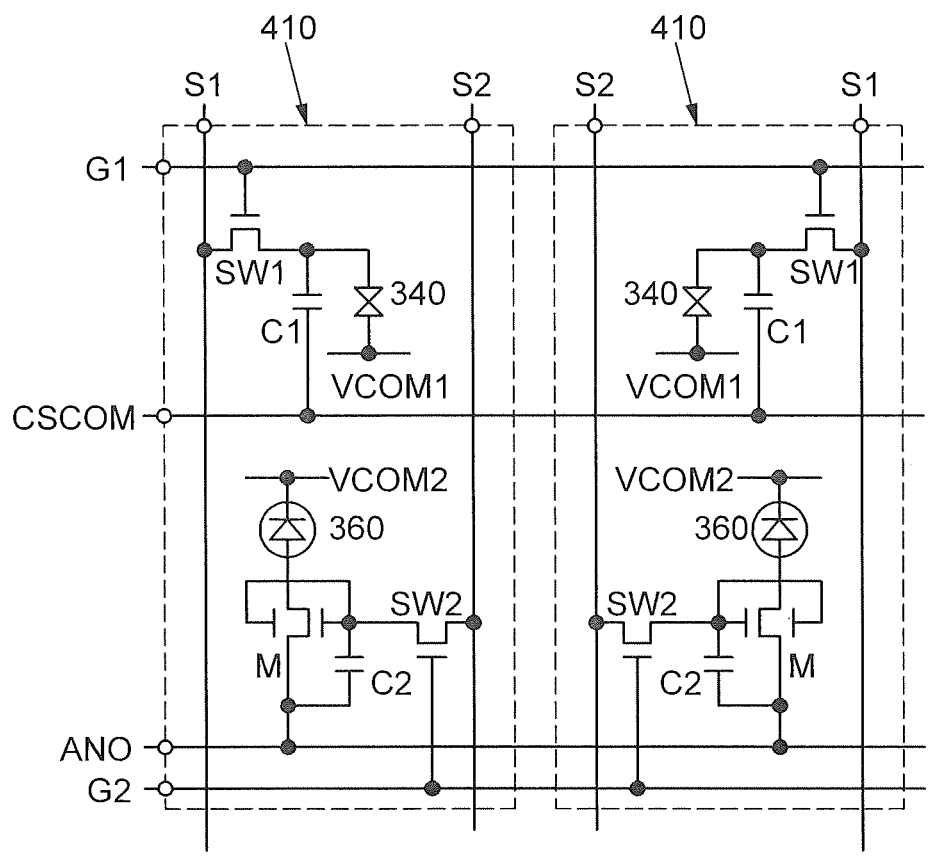
FIG. 16 illustrates pixel circuits.

FIG. 16 is a circuit diagram showing a configuration example of the pixel 410. FIG. 16 illustrates two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 16 also illustrates a wiring VCOM1 which is electrically connected to the liquid crystal element 340 and a wiring VCOM2 which is electrically connected to the light-emitting element 360.

FIG. 16 shows an example in which transistors are used as the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 16 shows an example in which the transistor M includes two gates connected to each other with a semiconductor provided therebetween. This structure can increase current that can flow through the transistor M.

The wiring G1 can be supplied with a signal for controlling the on/off state of the switch SW1. A predetermined potential can be supplied to the wiring VCOM1. The wiring S1 can be supplied with a signal for controlling the alignment of liquid crystal included in the liquid crystal element 340. A predetermined potential can be supplied to the wiring CSCOM.

The wiring G2 can be supplied with a signal for controlling the on/off state of the switch SW2. The wiring VCOM2 and the wiring ANO can be supplied with potentials having a difference large enough to make the light-emitting element 360 emit light. The wiring S2 can be supplied with a signal for controlling the conduction state of the transistor M.

In the reflective mode, for example, display can be performed by driving the pixel 410 in FIG. 16 with the signals supplied to the wiring G1 and the wiring S1 and utilizing the optical modulation of the liquid crystal element 340. In the transmissive mode, display can be performed by driving the pixel with the signals supplied to the wiring G2 and the wiring S2 to make the light-emitting element 360 emit light. In the case where both driving modes are combined, the pixel can be driven with the signals supplied to the wiring G1, the wiring G2, the wiring S1, and the wiring S2.

Figure 17A:
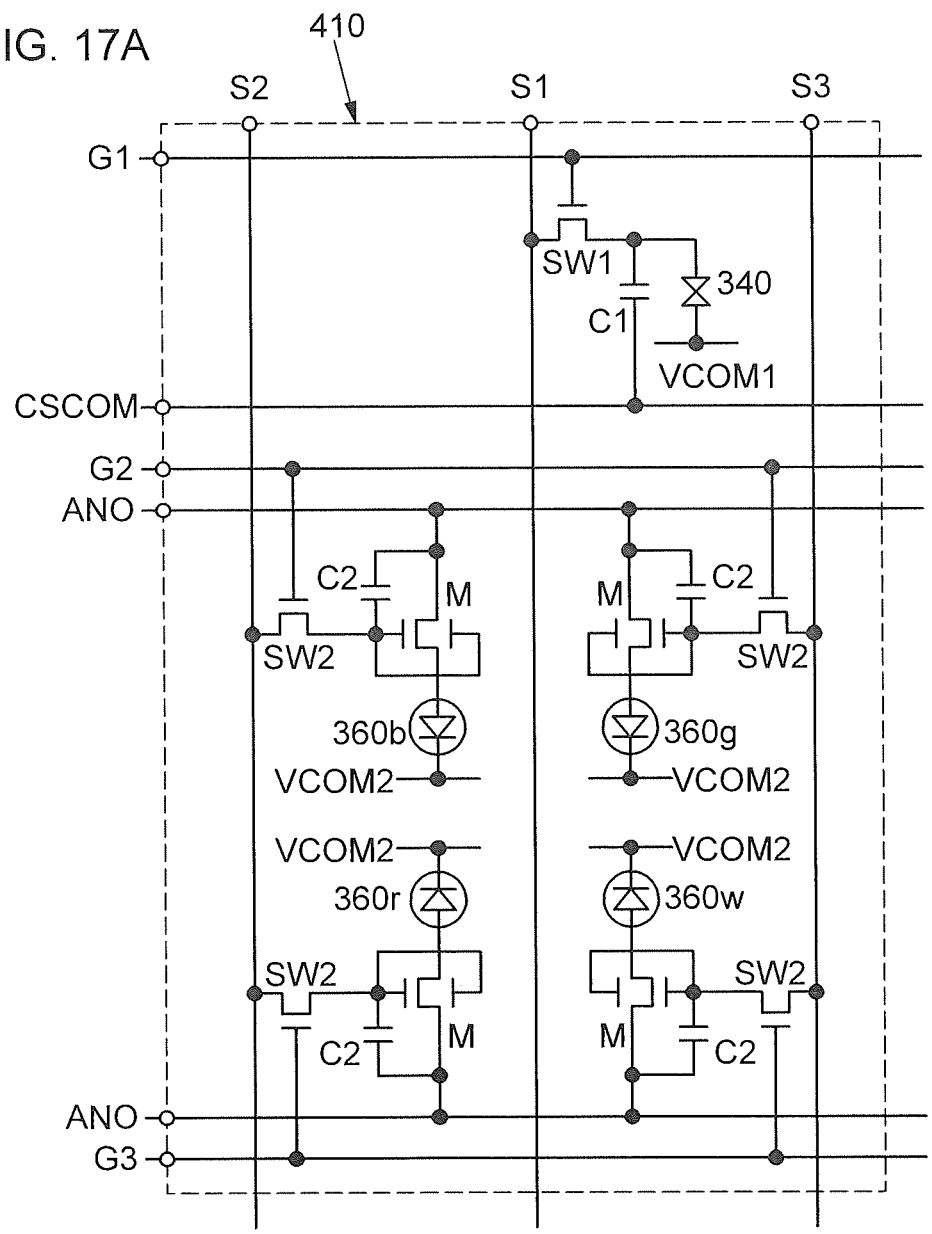
FIG. 17A illustrates a pixel circuit.

Note that one embodiment of the present invention is not limited to the example shown in FIG. 16, in which one pixel 410 includes one liquid crystal element 340 and one light-emitting element 360. FIG. 17A shows an example in which one pixel 410 includes one liquid crystal element 340 and four light-emitting elements 360 (light-emitting elements 360r, 360g, 360b, and 360w).

In FIG. 17A, in addition to the wirings in FIG. 16, a wiring G3 and a wiring S3 are connected to the pixel 410.

In the example shown in FIG. 17A, for example, light-emitting elements which exhibit red (R), green (G), blue (B), and white (W) can be used as the four light-emitting elements 360. A reflective liquid crystal element which exhibits white can be used as the liquid crystal element 340. This enables white display with high reflectance in the reflective mode. This also enables low-power display with excellent color-rendering properties in the transmissive mode.

Figure 17B:
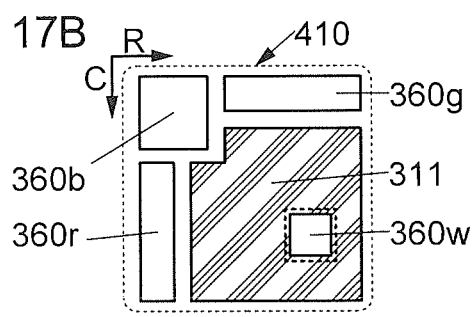
FIG. 17B is a top view of a pixel.

FIG. 17B shows a configuration example of the pixel 410. The pixel 410 includes the light-emitting element 360w which overlaps with an opening of an electrode 311 and the light-emitting elements 360r, 360g, and 360b which are located near the electrode 311. It is preferable that the light-emitting elements 360r, 360g, and 360b have substantially the same light-emitting area.

[Structure Example of Display Panel]

FIG. 18 is a schematic perspective view of a display panel 300 of one embodiment of the present invention. In the display panel 300, a substrate 351 and a substrate 361 are attached to each other. In FIG. 18, the substrate 361 is denoted by a dashed line.

The display panel 300 includes a display portion 362, a circuit 364, a wiring 365, and the like. The substrate 351 is provided with the circuit 364, the wiring 365, the conductive layer 311b that functions as a pixel electrode, and the like. FIG. 18 shows an example in which an IC 373 and an FPC 372 are mounted on the substrate 351. Thus, the structure illustrated in FIG. 18 can be referred to as a display module including the display panel 300, the FPC 372, and the IC 373.

As the circuit 364, for example, a circuit functioning as a scan line driver circuit can be used.

The wiring 365 has a function of supplying a signal and power to the display portion 362 and the circuit 364. The signal and the power are input to the wiring 365 from the outside through the FPC 372 or from the IC 373.

FIG. 18 shows an example in which the IC 373 is provided over the substrate 351 by a chip on glass (COG) method or the like. As the IC 373, for example, an IC functioning as a scan line driver circuit or a signal line driver circuit can be used. Note that the IC 373 may be omitted when, for example, the display panel 300 includes circuits functioning as a scan line driver circuit and a signal line driver circuit or when circuits functioning as a scan line driver circuit and a signal line driver circuit are externally provided and signals for driving the display panel 300 are input through the FPC 372. Alternatively, the IC 373 may be mounted on the FPC 372 by a chip on film (COF) method or the like.

FIG. 18 shows an enlarged view of a part of the display portion 362. The conductive layers 311b included in a plurality of display elements are arranged in a matrix in the display portion 362. The conductive layer 311b has a function of reflecting visible light and serves as a reflective electrode of the liquid crystal element 340 described later.

As illustrated in FIG. 18, the conductive layer 311b has an opening. The light-emitting element 360 is provided on the substrate 351 side of the conductive layer 311b. Light is emitted from the light-emitting element 360 to the substrate 361 side through the opening of the conductive layer 311b.

[Example of Cross-Sectional Structure]

Figure 19:
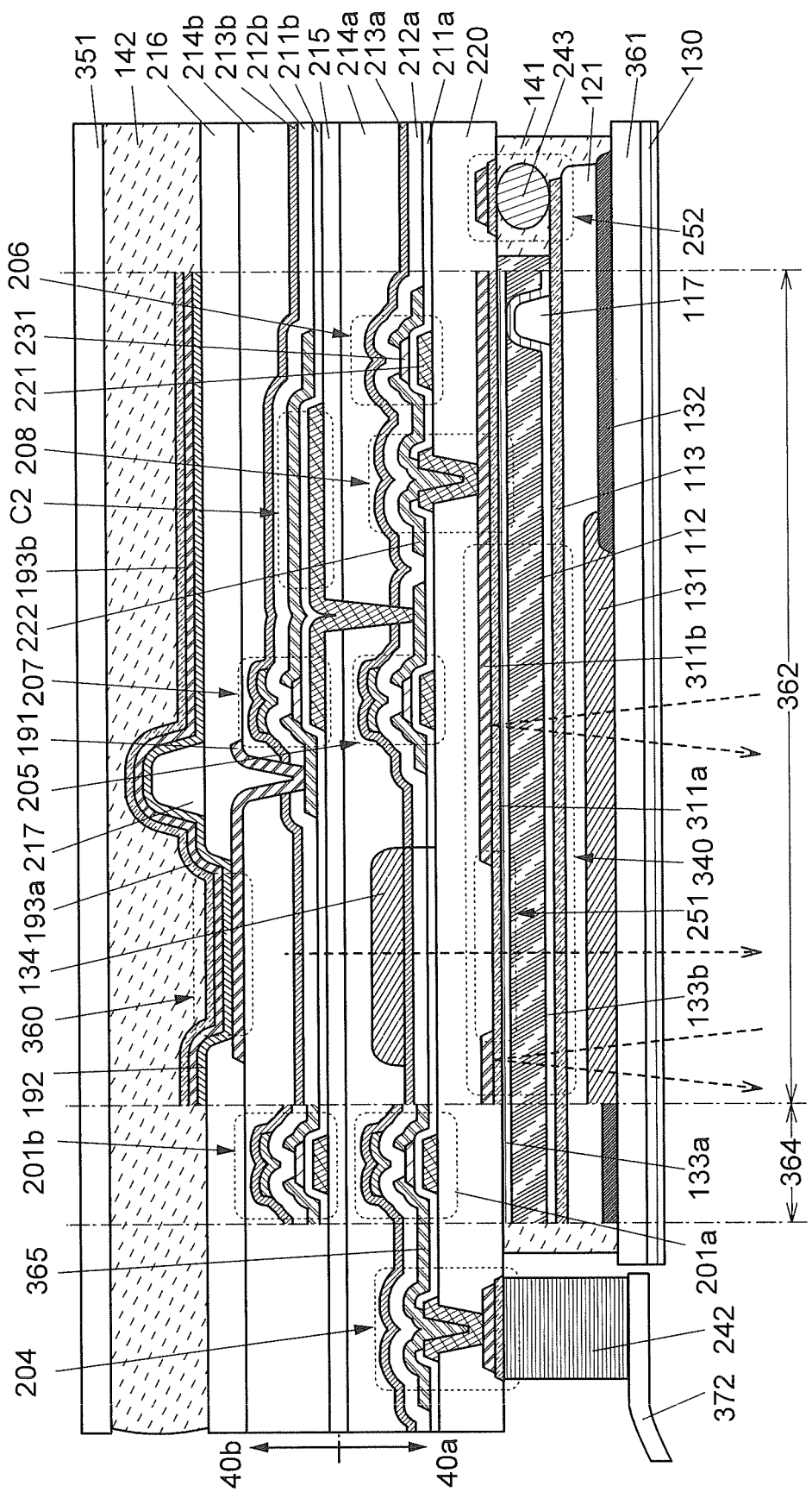
FIG. 19 is a cross-sectional view illustrating a structure of a display device.

FIG. 19 shows an example of cross sections of a part of a region including the FPC 372, a part of a region including the circuit 364, and a part of a region including the display portion 362 of the display panel exemplified in FIG. 18.

The display panel includes an insulating layer 220 between the substrate 351 and the substrate 361. The light-emitting element 360, a transistor 201a, a transistor 201b, a transistor 205, a transistor 206, a transistor 207, a coloring layer 134, and the like are provided between the substrate 351 and the insulating layer 220. The liquid crystal element 340, a coloring layer 131, and the like are provided between the insulating layer 220 and the substrate 361. The substrate 361 and the insulating layer 220 are attached to each other with an adhesive layer 141. The substrate 351 and the insulating layer 220 are attached to each other with an adhesive layer 142.

The transistor 206 is electrically connected to the liquid crystal element 340. The transistor 205 is electrically connected to the transistor 207. The transistor 207 is electrically connected to the light-emitting element 360. The transistor 205 and the transistor 206, which are both formed on a surface of the insulating layer 220 on the substrate 351 side, can be formed through the same process. Furthermore, since the transistor 207 is formed so as to overlap with the transistor 205, the pixel size can be reduced. Note that the capacitor C2 can be formed using a layer extending from a gate electrode of the transistor 207, a layer extending from a gate insulating film of the transistor 207, and a layer extending from one of a source electrode and a drain electrode of the transistor 207.

The coloring layer 131, a light-blocking layer 132, an insulating layer 121, and a conductive layer 113 functioning as a common electrode of the liquid crystal element 340, an alignment film 133b, an insulating layer 117, and the like are provided over the substrate 361. The insulating layer 117 functions as a spacer for keeping the cell gap of the liquid crystal element 340.

Insulating layers such as an insulating layer 211a, an insulating layer 212a, an insulating layer 213a, an insulating layer 214a, an insulating layer 215, an insulating layer 211b, an insulating layer 212b, an insulating layer 213b, an insulating layer 214b, and an insulating layer 216 are provided on the substrate 351 side of the insulating layer 220.

The insulating layer 211a partly functions as gate insulating layers of the transistors 205 and 206. The insulating layer 212a, the insulating layer 213a, and the insulating layer 214a are provided to cover the transistors 205 and 206.

The insulating layer 211b partly functions as a gate insulating layer of the transistor 207. The insulating layer 212b, the insulating layer 213b, and the insulating layer 214b are provided to cover the transistor 207.

The insulating layer 214a and the insulating layer 214b function as planarization layers. Note that the number of insulating layers which cover the transistors and the like is not limited to the example described here, i.e., three and may be one, two, or four or more. The insulating layers 214a and 214b functioning as planarization layers are not necessarily provided. Furthermore, the insulating layer 215, which is provided between the insulating layer 214a and the insulating layer 211b, is not necessarily provided.

The transistor 205, the transistor 206, and the transistor 207 each include a conductive layer 221 part of which functions as a gate, a conductive layer 222 part of which functions as a source or a drain, and a semiconductor layer 231.

The liquid crystal element 340 is a reflective liquid crystal element. The liquid crystal element 340 has a structure in which a conductive layer 311a, liquid crystal 112, and the conductive layer 113 are stacked. The conductive layer 311b that reflects visible light is provided in contact with a surface of the conductive layer 311a on the substrate 351 side. The conductive layer 311b has an opening 251. The conductive layer 311a and the conductive layer 113 each contain a material that transmits visible light. In addition, an alignment film 133a is provided between the liquid crystal 112 and the conductive layer 311a, and the alignment film 133b is provided between the liquid crystal 112 and the conductive layer 113. A polarizing plate 130 is provided on an outer surface of the substrate 361.

In the liquid crystal element 340, the conductive layer 311b has a function of reflecting visible light, and the conductive layer 113 has a function of transmitting visible light. Light entering from the substrate 361 side is polarized by the polarizing plate 130, passes through the conductive layer 113 and the liquid crystal 112, and is reflected by the conductive layer 311b. Then, the light passes through the liquid crystal 112 and the conductive layer 113 again and reaches the polarizing plate 130. In this case, optical modulation of the light can be controlled by controlling the alignment of the liquid crystal 112 with a voltage applied between the conductive layer 311b and the conductive layer 113. That is, the intensity of light extracted through the polarizing plate 130 can be controlled. Light other than that in a particular wavelength region is absorbed by the coloring layer 131, so that red light is extracted, for example.

The light-emitting element 360 is a bottom-emission light-emitting element. The light-emitting element 360 has a structure in which a conductive layer 191, an EL layer 192, and a conductive layer 193b are stacked in this order from the insulating layer 220 side. In addition, a conductive layer 193a is provided to cover the conductive layer 193b. The conductive layer 193b contains a material that reflects visible light, and the conductive layer 191 and the conductive layer 193a each contain a material that transmits visible light. Light is emitted from the light-emitting element 360 to the substrate 361 side through the coloring layer 134, the insulating layer 220, the opening 251, the conductive layer 113, and the like.

Here, as illustrated in FIG. 19, the opening 251 is preferably provided with the conductive layer 311a, which transmits visible light. Accordingly, the liquid crystal 112 is aligned in a region overlapping with the opening 251 as well as in the other region; therefore, an alignment defect of the liquid crystal in a boundary portion between these regions, which might cause undesired light leakage, can be suppressed.

As the polarizing plate 130 provided on the outer surface of the substrate 361, a linear polarizing plate or a circularly polarizing plate can be used. An example of a circularly polarizing plate is a stack of a linear polarizing plate and a quarter-wave retardation plate. Such a structure can suppress reflection of external light. The cell gap, alignment, drive voltage, and the like of the liquid crystal element used as the liquid crystal element 340 are adjusted in accordance with the kind of the polarizing plate so that desirable contrast is obtained.

An insulating layer 217 is provided over the insulating layer 216 which covers an end portion of the conductive layer 191. The insulating layer 217 functions as a spacer that prevents the substrate 351 from being unnecessarily close to the insulating layer 220. In addition, in the case where the EL layer 192 or the conductive layer 193a is formed using a blocking mask (metal mask), the insulating layer 217 may have a function of preventing the blocking mask from being in contact with a surface on which the EL layer 192 or the conductive layer 193a is to be formed. Note that the insulating layer 217 is not necessarily provided.

One of a source and a drain of the transistor 207 is electrically connected to the EL layer 192 of the light-emitting element 360 through the conductive layer 191.

One of a source and a drain of the transistor 206 is electrically connected to the conductive layer 311b through a connection portion 208. The conductive layer 311b and the conductive layer 311a are in contact with and electrically connected to each other. In the connection portion 208, the conductive layers provided on both surfaces of the insulating layer 220 are connected to each other through an opening of the insulating layer 220.

A connection portion 204 is provided in a region in which the substrate 351 and the substrate 361 do not overlap with each other. The connection portion 204 has a structure similar to that of the connection portion 208. In the connection portion 204, a conductive layer obtained by processing the same conductive film as the conductive layer 311a is exposed. Thus, the connection portion 204 and the FPC 372 can be electrically connected to each other through a connection layer 242.

A connection portion 252 is provided in a part of a region in which the adhesive layer 141 is provided. In the connection portion 252, a conductive layer obtained by processing the same conductive film as the conductive layer 311a is electrically connected to a part of the conductive layer 113 through a connector 243. Accordingly, a signal or a potential input from the FPC 372 connected on the substrate 351 side can be supplied to the conductive layer 113 formed on the substrate 361 side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 243, a material capable of elastic deformation or plastic deformation is preferably used. As illustrated in FIG. 19, the connector 243 which is a conductive particle has a vertically pressed shape in some cases. Accordingly, the contact area between the connector 243 and a conductive layer electrically connected to the connector 243 is increased, so that contact resistance can be reduced and problems such as disconnection can be suppressed.

The connector 243 is preferably provided so as to be covered with the adhesive layer 141. For example, the connector 243 may be dispersed in the adhesion layer 141 which is not cured yet.

FIG. 19 shows an example of the circuit 364 in which the transistors 201a and 201b are provided. For example, the transistor 201a corresponds to the transistor 71 included in the buffer circuit 70 described in Embodiment 1. The transistor 201b corresponds to the transistor 61 included in the shift register circuit 60 described in Embodiment 1.

The transistor 201a can be formed through the same process as the transistors 205 and 206. The transistor 201b can be formed through the same process as the transistor 207.

Note that the transistors included in the circuit 364 and the transistors included in the display portion 362 may have the same structure. The plurality of transistors included in the circuit 364 may have the same structure or different structures. The plurality of transistors included in the display portion 362 may have the same structure or different structures.

A material through which impurities such as water or hydrogen do not easily diffuse is preferably used for the insulating layers which cover the transistors, namely, at least one of the insulating layers 212*a* and 213*a* and at least one of the insulating layers 212*b* and 213*b*. That is, at least one of the insulating layers 212*a* and 213*a* and at least one of the insulating layers 212*b* and 213*b* can function as barrier films. Such a structure can effectively suppress diffusion of impurities from the outside into the transistors, and thus, a highly reliable display panel can be provided.

The insulating layer 121 is provided on the substrate 361 side to cover the coloring layer 131 and the light-blocking layer 132. The insulating layer 121 may function as a planarization layer. The insulating layer 121 enables the conductive layer 113 to have a substantially flat surface, resulting in a uniform alignment state of the liquid crystal 112.

[Components]

The above-mentioned components will be described below.

[Substrate]

A material having a flat surface can be used as each of the substrates included in the display panel. The substrate on the side from which light from the display element is extracted is formed using a material that transmits the light. For example, a material such as glass, quartz, ceramics, sapphire, or an organic resin can be used.

The weight and the thickness of the display panel can be reduced by using a thin substrate. Furthermore, a flexible display panel can be obtained by using a substrate that is thin enough to have flexibility.

The substrate through which light emission is not extracted does not need to have a light-transmitting property; therefore, besides the above-mentioned substrates, a metal substrate or the like can be used. A metal substrate is preferable because its high thermal conductivity enables heat to be easily conducted to the whole substrate, thereby suppressing a local temperature rise in the display panel. To obtain flexibility or bendability, the thickness of the metal substrate is preferably greater than or equal to 10 van and less than or equal to 200 μm, further preferably greater than or equal to 20 μm and less than or equal to 50 μm.

Although there is no particular limitation on the material of the metal substrate, for example, a metal such as aluminum, copper, or nickel or an alloy such as an aluminum alloy or stainless steel can be favorably used.

Alternatively, a substrate subjected to insulation treatment, such as a metal substrate whose surface is oxidized or provided with an insulating film, may be used. For example, an insulating film may be formed by a coating method such as a spin coating method or a dipping method, an electrodeposition method, an evaporation method, or a sputtering method. Alternatively, an oxide film may be formed on the surface of the substrate by leaving or heating the substrate in an oxygen atmosphere or by an anodic oxidation method or the like.

Examples of a material which has flexibility and transmits visible light include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a polyamide imide resin, a polyimide resin, or PET, whose thermal expansion coefficients are lower than or equal to $30 \times 10^{-6}$/K. A substrate in which a glass fiber is impregnated with an organic resin or a substrate whose thermal expansion coefficient is reduced by mixing an inorganic filler with an organic resin can also be used. A substrate using such a material is lightweight, and thus, a display panel using the substrate can also be lightweight.

In the case where a fibrous body is contained in the above material, a high-strength fiber of an organic compound or an inorganic compound is used as the fibrous body. The high-strength fiber specifically refers to a fiber with a high tensile elastic modulus or a high Young's modulus. Typical examples thereof include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, a glass fiber using E glass, S glass, D glass, Q glass, or the like can be used. These fibers may be used in a state of a woven or nonwoven fabric, and a structure body obtained by curing a resin with which such a fibrous body is impregnated may be used as a flexible substrate. The structure body including the fibrous body and the resin is preferably used as a flexible substrate, in which case the reliability in bending or breaking due to local pressure can be improved.

Alternatively, glass, metal, or the like that is thin enough to have flexibility can be used for the substrate. Alternatively, a composite material in which glass and a resin material are attached to each other with an adhesive layer may be used.

A hard coat layer (e.g., a silicon nitride layer or an aluminum oxide layer) which protects a surface of the display panel from damage, a layer of a material that can disperse pressure (e.g., an aramid resin layer), or the like may be stacked over the flexible substrate. To suppress, for example, a decrease in the lifetime of the display element due to moisture or the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. In particular, when a glass layer is used, a barrier property against water and oxygen can be improved, and thus, a highly reliable display panel can be provided.

[Transistor]

A transistor includes a conductive layer functioning as a gate electrode, a semiconductor layer, a conductive layer functioning as a source electrode, a conductive layer functioning as a drain electrode, and an insulating layer functioning as a gate insulating layer. In the above example, a bottom-gate transistor is used.

Note that there is no particular limitation on the structure of the transistor included in the display device of one embodiment of the present invention. For example, a planar transistor, a staggered transistor, or an inverted staggered transistor may be used. Furthermore, a top-gate transistor or a bottom-gate transistor may be used. Gate electrodes may be provided above and below a channel.

There is no particular limitation on the crystallinity of a semiconductor material used for the transistor, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used because deterioration of the transistor characteristics can be suppressed.

As a semiconductor material used for the transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAC-OS described later can be used.

A transistor including an oxide semiconductor which has a wider band gap and a lower carrier density than silicon has a low off-state current; therefore, charge accumulated in a capacitor that is series-connected to the transistor can be held for a long time.

As the semiconductor layer, for example, a film represented by an In-M-Zn-based oxide which contains indium, zinc, and M (a metal such as aluminum, titanium, gallium, germanium, yttrium, zirconium, lanthanum, cerium, tin, neodymium, or hafnium) can be used.

In the case where the oxide semiconductor included in the semiconductor layer is an In-M-Zn-based oxide, the atomic ratio of metal elements in a sputtering target used for depositing the In-M-Zn-based oxide preferably satisfies In≥M and Zn≥M. The atomic ratio of metal elements in such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio of metal elements in the deposited semiconductor layer may deviate from the above atomic ratio of metal elements in the sputtering target within a range of ±40%.

The bottom-gate transistor described in this embodiment is preferable because the number of manufacturing steps can be reduced. When an oxide semiconductor, which can be formed at a lower temperature than polycrystalline silicon, is used for the semiconductor layer, even materials with low heat resistance can be used for a wiring, an electrode, or a substrate below the semiconductor layer, so that the range of choices of materials can be widened. For example, an extremely large glass substrate can be favorably used.

An oxide semiconductor film with a low carrier density is used as the semiconductor layer. For the semiconductor layer, for example, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. Such an oxide semiconductor has a low impurity concentration and a low density of defect states and can thus be regarded as having stable characteristics.

Note that, without limitation to the above examples, a material with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When the oxide semiconductor included in the semiconductor layer contains silicon or carbon, which are elements belonging to Group 14, the number of oxygen vacancies in the semiconductor layer is increased, so that an n-type layer is formed. Hence, the concentration of silicon or carbon (measured by secondary ion mass spectrometry) in the semiconductor layer is lower than or equal to $2\times10^{18}$ atoms/$cm^3$, preferably lower than or equal to $2\times10^{17}$ atoms/$cm^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer, which is measured by secondary ion mass spectrometry, is lower than or equal to $1\times10^{18}$ atoms/$cm^3$, preferably lower than or equal to $2\times10^{16}$ atoms/$cm^3$.

When the oxide semiconductor included in the semiconductor layer contains nitrogen, electrons serving as carriers are generated and the carrier density is increased, so that the semiconductor layer easily becomes n-type. Thus, a transistor which includes an oxide semiconductor containing nitrogen is likely to have normally-on characteristics. Hence, the nitrogen concentration in the semiconductor layer, which is measured by secondary ion mass spectrometry, is preferably lower than or equal to $5\times10^{18}$ atoms/$cm^3$.

The semiconductor layer may have a non-single-crystal structure, for example. The non-single-crystal structure includes CAAC-OS (c-axis aligned crystalline oxide semiconductor or c-axis aligned a-b-plane-anchored crystalline oxide semiconductor) including a c-axis aligned crystal, a polycrystalline structure, a microcrystalline structure, or an amorphous structure, for example. Among the non-single-crystal structures, the amorphous structure has the highest density of defect states, whereas the CAAC-OS has the lowest density of defect states.

An oxide semiconductor film having an amorphous structure has, for example, disordered atomic arrangement and no crystalline component. In other words, an oxide film having an amorphous structure has, for example, a completely amorphous structure and no crystal part.

Note that the semiconductor layer may be a mixed film including two or more of the following regions: a region having an amorphous structure, a region having a microcrystalline structure, a region having a polycrystalline structure, a CAAC-OS region, and a region having a single-crystal structure. The mixed film has, for example, a single-layer structure or a stacked structure including two or more of the above-mentioned regions in some cases.

<Composition of CAC-OS>

Described below is the composition of a cloud aligned composite OS (CAC-OS) which can be used for a transistor disclosed in one embodiment of the present invention.

The CAC-OS refers to, for example, an oxide semiconductor material with a composition in which elements are unevenly distributed in regions each having a size of greater than or equal to 0.5 nm and less than or equal to 10 nm, preferably greater than or equal to 1 nm and less than or equal to 2 nm, or a similar size. Note that in the following description of an oxide semiconductor, the state in which one or more metal elements are unevenly distributed in regions each having a size of greater than or equal to 0.5 nm and less than or equal to 10 nm, preferably greater than or equal to 1 nm and less than or equal to 2 nm, or a similar size and the regions including the metal element(s) are mixed is referred to as a mosaic pattern or a patch-like pattern.

Note that the oxide semiconductor preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

As an example of the CAC-OS, an In—Ga—Zn oxide with the CAC composition (such an In—Ga—Zn oxide may be particularly referred to as CAC-IGZO) will be described. The CAC-IGZO has a composition with a mosaic pattern in which materials are separated into indium oxide ($InO_{X1}$, where X1 is a real number greater than 0) or indium zinc oxide ($In_{X2}Zn_{Y2}O_{Z2}$, where X2, Y2, and Z2 are each a real number greater than 0) and gallium oxide ($GaO_{X3}$, where X3 is a real number greater than 0) or gallium zinc oxide ($Ga_{X4}Zn_{Y4}O_{Z4}$, where X4, Y4, and Z4 are each a real number greater than 0), for example. Furthermore, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region has a higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compound has a single-crystal structure, a polycrystalline structure, or a CAAC structure. Note that the CAAC structure is a crystal structure in which a plurality of IGZO nanocrystals has c-axis alignment and is connected in the a-b plane direction without alignment.

On the other hand, the CAC-OS relates to the material composition of an oxide semiconductor. In part of the material composition of a CAC-OS containing In, Ga, Zn, and O, nanoparticle regions including Ga as a main component and nanoparticle regions including In as a main component are observed. These nanoparticle regions are randomly dispersed in a mosaic pattern. Therefore, the crystal structure is a secondary element for the CAC-OS.

Note that the CAC-OS does not include a stacked structure of two or more films with different compositions. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In part of the composition of a CAC-OS which contains, instead of gallium, one or more metal elements selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like, nanoparticle regions including the metal element(s) as a main component(s) and nanoparticle regions including In as a main component are observed. These nanoparticle regions are randomly dispersed in a mosaic pattern.

The CAC-OS can be formed by a sputtering method under conditions where a substrate is not heated intentionally, for example. In the case of forming the CAC-OS by a sputtering method, one or more gases selected from an inert gas (typically, argon), an oxygen gas, and a nitrogen gas may be used as a deposition gas. The percentage of the oxygen gas flow rate in the total flow rate of the deposition gas at the time of deposition is preferably as low as possible; for example, the percentage of the oxygen gas flow rate is preferably higher than or equal to 0% and lower than 30%, further preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in the plan-view direction and the cross-sectional direction.

For example, an energy dispersive X-ray spectroscopy (EDX) mapping image confirms that an In—Ga—Zn oxide with the CAC composition has a structure in which regions including $GaO_{X3}$ as a main component and regions including $In_{X2}Zn_{Y2}O_{Z2}$ or $InO_{X1}$ as a main component are unevenly distributed and mixed.

The CAC-OS has a structure and characteristics different from those of an IGZO compound in which metal elements are evenly distributed. That is, in the CAC-OS, regions including $GaO_{X3}$ or the like as a main component and regions including $In_{X2}Zn_{Y2}O_{Z2}$ or $InO_{X1}$ as a main component are phase-separated from each other in a mosaic pattern.

The conductivity of the region including $In_{X2}Zn_{Y2}O_{Z2}$ or $InO_{X1}$ as a main component is higher than that of the region including $GaO_{X3}$ or the like as a main component. In other words, when carriers flow through the region including $In_{X2}Zn_{Y2}O_{Z2}$ or $InO_{X1}$ as a main component, the oxide semiconductor exhibits conductivity. Accordingly, when the regions including $In_{X2}Zn_{Y2}O_{Z2}$ or $InO_{X1}$ as a main component are distributed in the oxide semiconductor like a cloud, a high field-effect mobility ($\mu$) can be achieved.

In contrast, the insulating property of the region including $GaO_{X3}$ or the like as a main component is higher than that of the region including $In_{X2}Zn_{Y2}O_2$ or $InO_{X1}$ as a main component. In other words, when the regions including $GaO_{X3}$ or the like as a main component are distributed in the oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and a high field-effect mobility ($\mu$) can be achieved.

A semiconductor element including a CAC-OS has a high reliability. Thus, the CAC-OS is suitably used for a variety of semiconductor devices typified by a display.

Alternatively, silicon may be used as a semiconductor in which a channel of the transistor is formed. Although amorphous silicon may be used as silicon, silicon having crystallinity is particularly preferable. For example, microcrystalline silicon, polycrystalline silicon, or single-crystal silicon is preferably used. In particular, polycrystalline silicon can be formed at a lower temperature than single-crystal silicon and has a higher field-effect mobility and a higher reliability than amorphous silicon.

The bottom-gate transistor described in this embodiment is preferable because the number of manufacturing steps can be reduced. When amorphous silicon, which can be formed at a lower temperature than polycrystalline silicon, is used for the semiconductor layer, even materials with low heat resistance can be used for a wiring, an electrode, or a substrate below the semiconductor layer, so that the range of choices of materials can be widened. For example, an extremely large glass substrate can be favorably used. Meanwhile, a top-gate transistor is preferable because an impurity region is easily formed in a self-aligned manner and variation in characteristics can be reduced. In this case, the use of polycrystalline silicon, single-crystal silicon, or the like is particularly preferable.

[Conductive Layer]

As examples of materials that can be used for a gate, a source, and a drain of a transistor, and conductive layers such as a variety of wirings and electrodes included in a display device, metals such as aluminum, titanium, chromium, nickel, copper, yttrium, zirconium, molybdenum, silver, tantalum, and tungsten and alloys containing these metals as their main components can be given. A single-layer or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because the shape controllability in etching is increased.

As a light-transmitting conductive material, a conductive oxide such as indium oxide, indium tin oxide, indium zinc oxide, zinc oxide, or zinc oxide to which gallium is added or graphene can be used. Alternatively, a metal material such as gold, silver, platinum, magnesium, nickel, tungsten, chromium, molybdenum, iron, cobalt, copper, palladium, or titanium or an alloy material containing the metal material can be used. Alternatively, a nitride of the metal material (e.g., titanium nitride) or the like may be used. In the case of using the metal material or the alloy material (or the nitride thereof), the thickness is set small enough to transmit light. Alternatively, a stacked film of any of the above materials can be used as the conductive layer. For example, a stacked film of indium tin oxide and an alloy of silver and magnesium is preferably used because the conductivity can be increased. These materials can also be used for conductive layers such as a variety of wirings and electrodes included in a display device and conductive layers (e.g., conductive layers functioning as a pixel electrode and a common electrode) included in a display element.

[Insulating Layer]

Examples of an insulating material that can be used for the insulating layers include a resin such as an acrylic resin or an epoxy resin, a resin having a siloxane bond, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element. Thus, a decrease in device reliability can be suppressed.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like may be used.

For example, the water vapor transmittance of the insulating film with low water permeability is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], still further preferably lower than or equal to $1\times10^{-8}$ [g/m$^2$·day].

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, the liquid crystal element can employ, besides the VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, or an antiferroelectric liquid crystal (AFLC) mode.

The liquid crystal element controls transmission or non-transmission of light by utilizing an optical modulation action of the liquid crystal. Note that the optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an antiferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used; an appropriate liquid crystal material may be used in accordance with the mode or design to be used.

In addition, to control the alignment of the liquid crystal, an alignment film can be provided. In the case where a horizontal electric field mode is employed, a liquid crystal exhibiting a blue phase for which an alignment film is unnecessary may be used. The blue phase is one of liquid crystal phases, which appears just before a cholesteric phase changes into an isotropic phase while the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes a liquid crystal exhibiting a blue phase and a chiral material has a short response time and optical isotropy. In addition, the liquid crystal composition which includes a liquid crystal exhibiting a blue phase and a chiral material does not need alignment treatment and has a small viewing angle dependence. Since an alignment film need not be provided and rubbing treatment is unnecessary, electrostatic discharge damage caused by the rubbing treatment can be prevented and defects and damage of the liquid crystal display device in the manufacturing process can be reduced.

As the liquid crystal element, a transmissive liquid crystal element, a reflective liquid crystal element, a semi-transmissive liquid crystal element, or the like can be used.

In one embodiment of the present invention, in particular, a reflective liquid crystal element can be used.

In the case where a transmissive or semi-transmissive liquid crystal element is used, two polarizing plates are provided so that a pair of substrates is sandwiched therebetween. A backlight is provided outside one of the polarizing plates. As the backlight, a direct-lit backlight or an edge-lit backlight may be used. A direct-lit backlight including a light-emitting diode (LED) is preferably used because local dimming is easily performed to improve contrast. An edge-lit backlight is preferably used because the thickness of a module including the backlight can be reduced.

In the case where a reflective liquid crystal element is used, a polarizing plate is provided on the display surface side. In addition, a light diffusion plate is preferably provided on the display surface side to improve visibility.

In the case where a reflective or semi-transmissive liquid crystal element is used, a front light may be provided outside the polarizing plate. As the front light, an edge-lit front light is preferably used. A front light including an LED is preferably used because power consumption can be reduced.

[Light-Emitting Element]

As the light-emitting element, a self-luminous element can be used, and an element whose luminance is controlled by current or voltage is included in the category of the light-emitting element. For example, an LED, an organic EL element, or an inorganic EL element can be used.

The light-emitting element has a top emission structure, a bottom emission structure, a dual emission structure, or the like. A conductive film that transmits visible light is used as an electrode through which light is extracted. A conductive film that reflects visible light is preferably used as an electrode through which light is not extracted.

The EL layer includes at least a light-emitting layer. In addition to the light-emitting layer, the EL layer may include a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

Either a low-molecular compound or a high-molecular compound can be used for the EL layer, and an inorganic compound may also be used. Each of the layers included in the EL layer can be formed by an evaporation method (including a vacuum evaporation method), a transfer method, a printing method, an inkjet method, a coating method, or the like.

When a voltage higher than the threshold voltage of the light-emitting element is applied between a cathode and an anode, holes from the anode side and electrons from the cathode side are injected into the EL layer. The injected electrons and holes are recombined in the EL layer, so that a light-emitting substance contained in the EL layer emits light.

In the case where a light-emitting element emitting white light is used as the light-emitting element, the EL layer preferably contains two or more kinds of light-emitting substances. For example, two or more light-emitting substances which emit light of complementary colors may be selected to obtain white light emission. Specifically, the EL layer preferably contains two or more light-emitting substances selected from light-emitting substances which emit light of red (R), green (G), blue (B), yellow (Y), orange (O), and the like and light-emitting substances which emit light including two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in a yellow wavelength region preferably includes spectral components also in green and red wavelength regions.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other, or a region which contains neither of the light-emitting materials may be provided between the stacked light-emitting layers. For example, between a fluorescent layer and a phosphorescent layer, a region which contains the same material (e.g., a host material or an assist material) as the fluorescent layer or the phosphorescent layer and neither of their light-emitting materials may be provided. This facilitates the manufacture of the light-emitting element and reduces the drive voltage.

The light-emitting element may be a single element including one EL layer or a tandem element in which a plurality of EL layers is stacked with a charge generation layer provided therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium, an alloy containing the metal material, a nitride of the metal material (e.g., titanium nitride), or the like can be used when formed thin enough to transmit light. Alternatively, a stacked film of any of the above materials can be used as the conductive layer. For example, a stacked film of indium tin oxide and an alloy of silver and magnesium is preferably used because the conductivity can be increased. Alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing the metal material can be used. Lanthanum, neodymium, germanium, or the like may be added to the metal material or the alloy. Alternatively, an aluminum alloy may be used, namely an alloy containing aluminum and titanium, nickel, or neodymium. Alternatively, an alloy containing silver and copper, palladium, or magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material of the metal film or the metal oxide film include titanium and titanium oxide. Alternatively, the conductive film that transmits visible light and a film containing the above metal material may be stacked. For example, a stacked film of silver and indium tin oxide or a stacked film of indium tin oxide and an alloy of silver and magnesium can be used.

Each of the electrodes may be formed by an evaporation method or a sputtering method. Alternatively, a discharging method such as an inkjet method, a printing method such as a screen printing method, or a plating method can be used.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may each contain an inorganic compound such as a quantum dot or a high-molecular compound (e.g., an oligomer, a dendrimer, or a polymer). For example, a quantum dot used for the light-emitting layer can function as a light-emitting material.

The quantum dot may be a colloidal quantum dot, an alloyed quantum dot, a core-shell quantum dot, a core quantum dot, or the like. A material containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

[Adhesive Layer]

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component resin may be used. Alternatively, an adhesive sheet or the like may be used.

Furthermore, the resin may contain a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably contained because it can prevent impurities such as moisture from entering the element, thereby improving the reliability of the display panel.

In addition, a filler with a high refractive index or a light-scattering member may be mixed with the resin, in which case the light extraction efficiency can be improved. For example, titanium oxide, barium oxide, zeolite, or zirconium can be used.

[Connection Layer]

As the connection layer, an anisotropic conductive film (ACF), an anisotropic conductive paste (ACP), or the like can be used.

[Coloring Layer]

Examples of a material that can be used for the coloring layer include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. A stack of films containing materials of the coloring layers can also be used as the light-blocking layer. For example, a stacked structure of a film containing a material of a coloring layer that transmits light of a certain color and a film containing a material of a coloring layer that transmits light of another color can be employed. The coloring layer and the light-blocking layer are preferably formed using the same material because the same manufacturing apparatus can be used and the process can be simplified.

At least part of this embodiment can be implemented in combination with any of the other embodiments described in this specification as appropriate.

Embodiment 5

Examples of an electronic device for which the display device of one embodiment of the present invention can be used include display apparatuses, personal computers, image storage devices or image reproducing devices provided with recording media, mobile phones, game machines (including portable game consoles), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 20A to 20F show specific examples of these electronic devices.

Figure 20A:
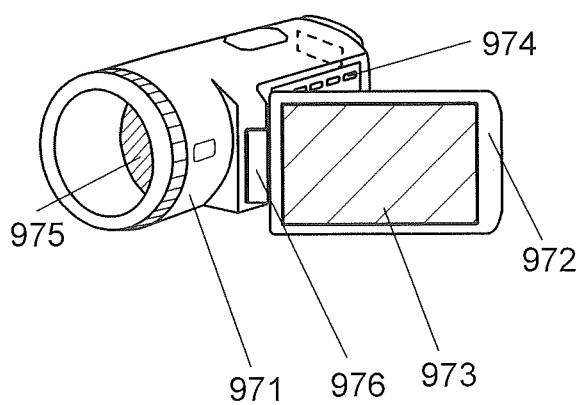
FIGS. 20A to 20F illustrate electronic devices.

FIG. 20A illustrates a video camera which includes a first housing 971, a second housing 972, a display portion 973, an operation key 974, a lens 975, a joint 976, and the like. The operation key 974 and the lens 975 are provided in the first housing 971, and the display portion 973 is provided in the second housing 972. The display portion 973 of the video camera includes the display device of one embodiment of the present invention, so that outdoor visibility can be improved and low power consumption can be achieved.

Figure 20B:
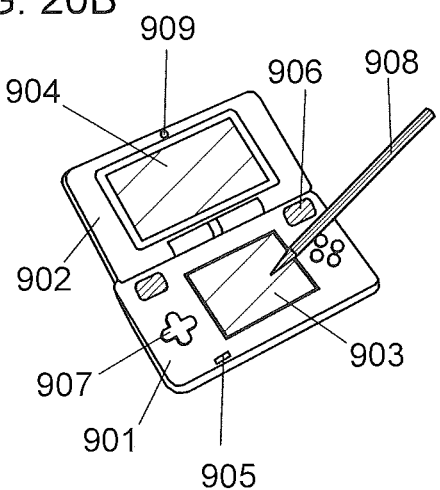

FIG. 20B illustrates a portable game console which includes a housing 901, a housing 902, a display portion 903, a display portion 904, a microphone 905, a speaker 906, an operation key 907, a stylus 908, a camera 909, and the like. Although the portable game console in FIG. 20B has the two display portions 903 and 904, the number of display portions included in the portable game console is not limited thereto. The display portion 903 of the portable game console includes the display device of one embodiment of the present invention, so that outdoor visibility can be improved and low power consumption can be achieved.

Figure 20C:
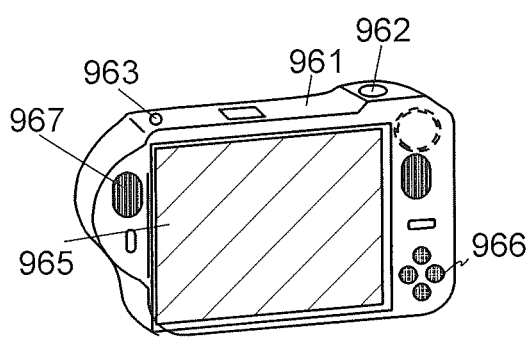

FIG. 20C illustrates a digital camera which includes a housing 961, a shutter button 962, a microphone 963, a speaker 967, a display portion 965, an operation key 966, and the like. The display portion 965 of the digital camera includes the display device of one embodiment of the present invention, so that outdoor visibility can be improved and low power consumption can be achieved.

Figure 20D:
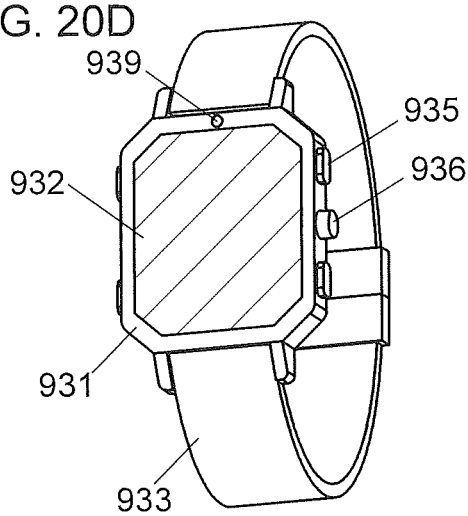

FIG. 20D illustrates a wrist-watch-type information terminal which includes a housing 931, a display portion 932, a wristband 933, an operation button 935, a crown 936, a camera 939, and the like. The display portion 932 may be a touch panel. The display portion 932 of the information terminal includes the display device of one embodiment of the present invention, so that outdoor visibility can be improved. Furthermore, the bezel can be narrowed, and thus, the design can be improved.

Figure 20E:
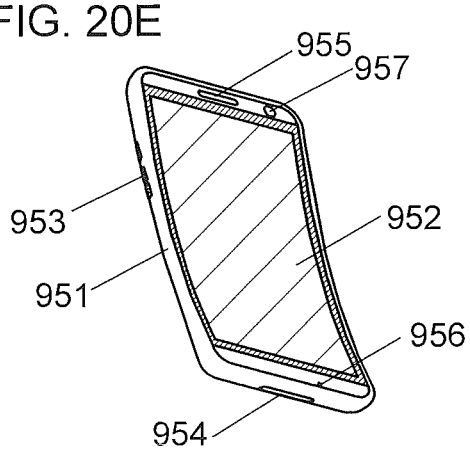

FIG. 20E shows an example of a mobile phone which includes a housing 951, a display portion 952, an operation button 953, an external connection port 954, a speaker 955, a microphone 956, a camera 957, and the like. The display portion 952 of the mobile phone includes a touch sensor. Operations such as making a call and inputting text can be performed by touch on the display portion 952 with a finger, a stylus, or the like. The display portion 952 of the mobile phone includes the display device of one embodiment of the present invention, so that outdoor visibility can be improved. Furthermore, the bezel can be narrowed, and thus, the design can be improved.

Figure 20F:
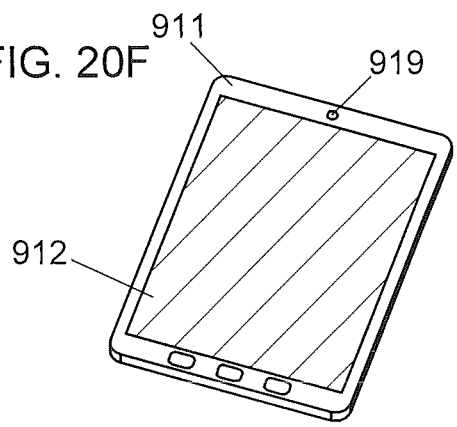

FIG. 20F illustrates a portable data terminal which includes a housing 911, a display portion 912, a camera 919, and the like. A touch panel function of the display portion 912 enables input and output of information. The display portion 912 of the portable data terminal includes the display device of one embodiment of the present invention, so that outdoor visibility can be improved. Furthermore, the bezel can be narrowed, which leads to size reduction.

At least part of this embodiment can be implemented in combination with any of the other embodiments described in this specification as appropriate.

This application is based on Japanese Patent Application serial No. 2016-142898 filed with Japan Patent Office on Jul. 21, 2016, the entire contents of which are hereby incorporated by reference.

What is claimed is:

1. A display device comprising:
a pixel circuit and a driver circuit over a substrate,
wherein the driver circuit includes a shift register circuit and a buffer circuit,
wherein the shift register circuit includes a first transistor,
wherein the buffer circuit includes a second transistor,
wherein the shift register circuit is provided over the buffer circuit,
wherein the first transistor has a same conductivity type as the second transistor,
wherein one of a source and a drain of the first transistor is electrically connected to a gate of the second transistor, and
wherein a channel length direction of the first transistor is not in parallel with a channel length direction of the second transistor.

2. The display device according to claim 1, wherein the driver circuit is a gate driver.

3. The display device according to claim 1, further comprising a planarization film between the shift register circuit and the buffer circuit.

4. The display device according to claim 1, wherein channel formation regions of the plurality of first transistors and the plurality of second transistors include a metal oxide.

5. An electronic device comprising a touch sensor overlapping with the display device, and the display device according to claim 1.

6. A display device comprising:
a pixel circuit and a driver circuit over a substrate,
wherein the driver circuit includes a shift register circuit and a buffer circuit,
wherein the shift register circuit includes a first transistor,
wherein the buffer circuit includes a second transistor,
wherein the shift register circuit is provided over the buffer circuit,
wherein a width of the buffer circuit is larger than a width of the shift register circuit,
wherein the first transistor has a same conductivity type as the second transistor,
wherein one of a source and a drain of the first transistor is electrically connected to a gate of the second transistor, and
wherein a channel length direction of the first transistor is not in parallel with a channel length direction of the second transistor.

7. The display device according to claim 6, wherein the driver circuit is a gate driver.

8. The display device according to claim 6, further comprising a planarization film between the shift register circuit and the buffer circuit.

9. The display device according to claim 6, wherein channel formation regions of the plurality of first transistors and the plurality of second transistors include a metal oxide.

10. An electronic device comprising a touch sensor overlapping with the display device, and the display device according to claim 6.

* * * * *